United States Patent
Fujioka et al.

(10) Patent No.: US 12,237,423 B2
(45) Date of Patent: Feb. 25, 2025

(54) InGaAlN-BASED SEMICONDUCTOR DEVICE

(71) Applicant: JAPAN SCIENCE AND TECHNOLOGY AGENCY, Kawaguchi (JP)

(72) Inventors: Hiroshi Fujioka, Saitama (JP); Atsushi Kobayashi, Saitama (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 86 days.

(21) Appl. No.: 14/912,702

(22) PCT Filed: Aug. 28, 2014

(86) PCT No.: PCT/JP2014/004419
§ 371 (c)(1),
(2) Date: Apr. 22, 2016

(87) PCT Pub. No.: WO2015/029435
PCT Pub. Date: Mar. 5, 2015

(65) Prior Publication Data
US 2016/0225913 A1    Aug. 4, 2016

(30) Foreign Application Priority Data

Aug. 30, 2013   (JP) .................... 2013-179984

(51) Int. Cl.
*H01L 29/04*   (2006.01)
*H01L 29/20*   (2006.01)
*H01L 29/786*  (2006.01)

(52) U.S. Cl.
CPC ........ *H01L 29/78681* (2013.01); *H01L 29/04* (2013.01); *H01L 29/2006* (2013.01); *H01L 29/78603* (2013.01); *H01L 29/78696* (2013.01)

(58) Field of Classification Search
CPC .............. H01L 29/04; H01L 29/2006; H01L 29/78603; H01L 29/78681; H01L 29/78696

(Continued)

(56) References Cited

U.S. PATENT DOCUMENTS 3,696,276 A * 10/1972 Boland ............. H01L 21/02238
257/411
6,177,685 B1 * 1/2001 Teraguchi ............. H01L 29/201
257/192

(Continued)

FOREIGN PATENT DOCUMENTS

CN    103779424 A   5/2014
JP    2751963 B2    5/1998

(Continued)

OTHER PUBLICATIONS

International Search Report issued Nov. 25, 2014 in corresponding PCT/JP 2014/004418 (with English translation).

(Continued)

*Primary Examiner* — Ori Nadav
(74) *Attorney, Agent, or Firm* — Oblon, McClelland, Maier & Neustadt, L.L.P.

(57) ABSTRACT

Transistors using nitride semiconductor layers as channels were experimentally manufactured. The nitride semiconductor layers were all formed through a sputtering method. A deposition temperature was set at less than 600° C., and a polycrystalline or amorphous $In_xGa_yAl_zN$ layer was obtained. When composition expressed with a general (Continued)

expression $In_xGa_yAl_zN$ (where $x+y+z=1.0$) falls within a range of $0.3 \leq x \leq 1.0$ and $0 \leq z < 0.4$, a transistor 1a exhibiting an ON/OFF ratio of $10^2$ or higher can be obtained. That is, even a polycrystalline or amorphous film exhibits electric characteristics equal to those of a single crystal. Therefore, it is possible to provide a semiconductor device in which constraints to manufacturing conditions are drastically eliminated, and which includes an InGaAlN-based nitride semiconductor layer which is inexpensive and has excellent electric characteristics as a channel.

20 Claims, 20 Drawing Sheets

(58) Field of Classification Search
USPC .......................................................... 257/57
See application file for complete search history.

(56) References Cited

U.S. PATENT DOCUMENTS

| | | | | |
|---|---|---|---|---|
| 6,955,933 | B2* | 10/2005 | Bour | H01L 33/32 |
| | | | | 257/E33.008 |
| 8,482,035 | B2* | 7/2013 | Briere | H01L 29/7783 |
| | | | | 257/E29.252 |
| 2003/0102482 | A1* | 6/2003 | Saxler | H01L 29/7783 |
| | | | | 257/85 |
| 2006/0043380 | A1* | 3/2006 | Hiroshi | H01L 33/0041 |
| | | | | 257/79 |
| 2007/0138506 | A1* | 6/2007 | Braddock | H01L 29/513 |
| | | | | 257/E29.253 |
| 2008/0122341 | A1 | 5/2008 | Orita et al. | |
| 2008/0237610 | A1* | 10/2008 | Imanishi | H01L 21/02581 |
| | | | | 257/77 |
| 2010/0163863 | A1* | 7/2010 | Yaegashi | H01L 29/7869 |
| | | | | 257/43 |
| 2010/0276732 | A1* | 11/2010 | Ando | H01L 29/0891 |
| | | | | 257/192 |
| 2012/0267686 | A1* | 10/2012 | Jeon | H01L 29/404 |
| | | | | 257/E21.403 |
| 2013/0062606 | A1 | 3/2013 | Tsang | |
| 2013/0087783 | A1 | 4/2013 | Wang et al. | |
| 2013/0196468 | A1* | 8/2013 | Yamazaki | H01L 29/66742 |
| | | | | 438/104 |
| 2013/0313561 | A1* | 11/2013 | Suh | H01L 29/7787 |
| | | | | 257/E21.403 |
| 2014/0001478 | A1* | 1/2014 | Saunier | H01L 29/7786 |
| | | | | 257/E21.403 |
| 2014/0264379 | A1* | 9/2014 | Kub | H01L 29/41725 |
| | | | | 257/77 |
| 2014/0264431 | A1* | 9/2014 | Lal | H01L 29/4175 |
| | | | | 257/195 |
| 2014/0332805 | A1* | 11/2014 | Ohshima | H01L 27/0688 |
| | | | | 257/43 |

FOREIGN PATENT DOCUMENTS

| | | |
|---|---|---|
| JP | 11-204778 | 7/1999 |
| JP | 2000-22205 | 1/2000 |
| JP | 2005-303250 | 10/2005 |
| JP | 2007-81362 | 3/2007 |
| JP | 2009-194324 | 8/2009 |
| JP | 2010-34534 | 2/2010 |
| JP | 2012-169470 | 9/2012 |
| JP | 2012-169470 A | 9/2012 |
| JP | 2012-199549 | 10/2012 |
| JP | 2012-231129 | 11/2012 |
| JP | 2012-238751 | 12/2012 |
| JP | 2012-238751 A | 12/2012 |
| WO | WO 2004/109767 A2 | 12/2004 |
| WO | WO 2012/026396 A1 | 3/2012 |

OTHER PUBLICATIONS

International Search Report issued Dec. 9, 2014 in corresponding PCT/JP 2014/004419 (with English translation).

Jhumpa Adhikari, et al., "Molecular simulation study of miscibility of ternary and quaternary InGaAlN alloys", Journal of Applied Physics, vol. 95, Nu. 11, Jun. 1, 2004, 10 pages.

T. Honke, et al., "InN epitaxial growths on Yttria stabilized zirconia (111) step substrates", J. Vac. Sci. Technol. A 22(6), 2004, American Vacuum Society, 4 pages.

Andreas Knübel, et al., "Transport characteristics of indium nitride (InN) films grown by plasma assisted molecular beam epitaxy (PAMBE)", Physica Status Solidi C 6, No. 6, 2009, pp. 1480-1483.

Chris G. Van de Walle, et al., "Universal alignment of hydrogen levels in semiconductors, insulators and solutions", Letters to nature, Nature, vol. 423, Jun. 5, 2003, 3 pages.

Extended European Search Report issued Mar. 23, 2017 in Patent Application No. 14840925.3.

Office Action issued Feb. 14, 2017 in Japanese Patent Application No. 2015-533999.

Tilman Beierlein, et al., "Properties of InGaN deposited on Glass at Low Temperature", Internet Journal of NSR, vol. 2, No. 29, 1997, 15 pages.

Korean Office Action dated Oct. 28, 2020, in Korean Patent Application No. 10-2016-7008344 (with English Translation).

Korean Office Action dated Jan. 12, 2021, in Korean Patent Application No. 10-2016-7008344 (with English Translation).

Korean Office Action dated Mar. 31, 2021, in Korean Patent Application No. 10-2020-7037244 (with English Translation).

* cited by examiner (A)

(B)

(A)

(B)

(C)

(D)

InGaAlN-BASED SEMICONDUCTOR DEVICE

TECHNICAL FIELD

The present invention relates to a semiconductor device, and, more particularly, to a semiconductor device including an InGaAlN-based nitride semiconductor layer exhibiting favorable device properties even when the InGaAlN-based nitride semiconductor layer is a polycrystal or amorphous.

BACKGROUND ART

Because an InGaAlN-based nitride semiconductor exhibits high electron mobility and high saturation electron velocity, the InGaAlN-based nitride semiconductor attracts attention as a high-speed electronic device material which responds to a higher frequency than a conventional transistor.

For example, concerning InN, there have been a lot of reported cases as to electrical characteristics so far, and, while InN exhibits excellent characteristics of electron mobility of 3570 [cm$^2$/Vs] and saturation electron velocity of 2.6×10$^7$ [cm/s], because InN is likely to cause a defect that a Fermi level is fixed in a conduction band (Non Patent Literature 1), it is not easy to realize even basic transistor operation of controlling a current using an external signal.

As disclosed in Non Patent Literature 2, it is typically known that the electric characteristics of InN, such as mobility, becomes poorer as a film thickness is made thinner, which is interpreted to be because defects exist more intensively on a surface or an interface than inside an InN thin film. That is, it is considered that one cause of a transistor using InN not operating is that a lot of defects occur at the interface with a layer or a substrate bonded to the InN layer, and it can be easily imagined that density of these defects depends on a difference in a lattice constant between a foundation layer or the substrate and the InN (lattice constant difference) when the InN layer is grown.

It is generally considered that a transistor using an InGaAlN-based nitride semiconductor such as InN as a channel does not operate unless the semiconductor layer is a single crystal, and therefore, a single crystal substrate has been used as a film formation substrate. It should be noted that Patent Literature 1 (Japanese Patent Laid-Open No. 2000-22205) discloses an invention of a semiconductor light-emitting element in which light-emitting properties is obtained by laminating a layer formed with an n-type semiconductor relatively easily obtained and a hole transporting layer made of an organic compound, using the hole transporting layer made of the organic compound in place of a p-type semiconductor of a pn-junction type LED device, and injecting a hole in the n-type semiconductor, and, while Patent Literature 1 discloses that a substrate used at that time may be a non-single crystalline substrate, the semiconductor layer is not used as a channel in the semiconductor light-emitting element.

For example, because single crystalline GaN and single crystalline sapphire which are currently utilized by a number of researchers as a substrate for growing InN have a lattice constant drastically different from the lattice constant of InN, it can be easily understood that if a crystal of InN is grown on such a substrate, a defect is likely to occur at an interface with the substrate. It is forecasted that a problem caused by such lattice mismatch can be solved to some extent by using an yttria-stabilized zirconia (YSZ) substrate (Non Patent Literature 3) which has a close lattice constant to that of InN.

However, typically, because a single crystalline substrate is expensive, a semiconductor device manufactured by growing the InGaAlN-based nitride semiconductor layer using such a substrate becomes inevitably expensive, and there are various kinds of constraints to growth conditions in order that the nitride semiconductor becomes a single crystal.

CITATION LIST

Patent Literature

Patent Literature 1: Japanese Patent Laid-Open No. 2000-22205

Non Patent Literature

Non Patent Literature 1: C. G. Van de Walle & J. Neugebauer Nature 423, 626 (2003)

Non Patent Literature 2: Andreas Knubel, Rolf Aidam, Volker Cimalla, Lutz Kirste, Martina Baeumler, Crenguta-Columbina Leancu, Vadim Lebedev, Jan Wallauer, Markus Walther, and Joachim Wagner, Phys. Status Solidi C 6, No. 6 (2009)

Non Patent Literature 3: T. Honke, H. Fujioka, J. Ohta, and M. Oshima, J. Vac. Sci. Technol. A 22, 2487 (2004)

Non Patent Literature 4: Jhumpa Adhikari and David A. Kofke, "Molecular simulation study of miscibility of ternary and quaternary InGaAlN alloys", JOURNAL OF APPLIED PHYSICS, Vol. 95, p. 6129-6137 (2004).

SUMMARY OF INVENTION

Technical Problem

In this manner, conventionally, because the electric characteristics of InN, such as mobility, have been considered to be poorer as a film thickness of the InN is made thinner, and because it has been considered that the semiconductor device does not operate unless an InGaAlN-based nitride semiconductor layer is made of a single crystal, film forming conditions of the InGaAlN-based nitride semiconductor layer inevitably lack flexibility, which makes it difficult to even realize basic transistor operation.

The present invention has been made in view of such problems, and an object of the present invention is to realize a semiconductor device which drastically eliminates constraints to manufacturing conditions based on an idea completely different from the conventional idea, and which includes the InGaAlN-based nitride semiconductor layer which is inexpensive and has excellent electric characteristics.

Solution to Problem

To solve the above-described problem, the semiconductor device according to the present invention is a semiconductor device in which a polycrystalline or amorphous nitride semiconductor layer expressed with a general expression $In_xGa_yAl_zN$ (where x+y+z=1.0) is provided on a substrate, and composition of the nitride semiconductor layer falls within a range of 0.3≤x≤1.0 and 0≤z<0.4, the semiconductor device including the nitride semiconductor layer as a channel.

Preferably, the composition of the nitride semiconductor layer falls within a range of $0 \leq z < 0.2$ when $0.3 \leq x < 0.7$ and falls within a range of $0 \leq z < 0.1$ when $0.7 \leq x \leq 1.0$.

More preferably, the composition of the nitride semiconductor layer falls within a range of $0.5 \leq x \leq 1.0$ and $0 \leq z < 0.1$.

Further preferably, an In composition ratio of the nitride semiconductor layer is 0.99 or lower ($x \leq 0.99$).

In a preferred aspect, an insulating layer is provided between the substrate and the nitride semiconductor layer, and the insulating layer is one of a $HfO_2$ layer, an $Al_2O_3$ layer and a $SiO_2$ layer.

Preferably, the nitride semiconductor layer is a film deposited through a sputtering method. For example, the nitride semiconductor layer is a film deposited through a pulsed sputtering deposition method (PSD method).

Preferably, the nitride semiconductor layer is a film formed at a temperature of less than 600° C.

In one aspect, the substrate is a non-single crystalline substrate.

Further, in one aspect, the substrate is an insulating substrate. For example, the substrate is a fused silica substrate.

In one aspect, the semiconductor device has a laminate structure in which a second nitride semiconductor layer having composition different from that of the nitride semiconductor layer is bonded on at least one principle surface of the nitride semiconductor layer.

In this case, the second nitride semiconductor layer may be a nitride semiconductor layer having the above-described composition.

For example, the semiconductor device is a field effect transistor which uses the nitride semiconductor layer as a channel, and has an ON/OFF ratio of $10^2$ or higher.

Advantageous Effects of Invention

The present invention is based on new finding that when composition of an InGaAlN-based nitride semiconductor is designed to fall within an appropriate range, even when a nitride semiconductor layer is a polycrystal or amorphous, the InGaAlN-based nitride semiconductor exhibits excellent electric characteristics sufficient to realize transistor operation. According to the present invention, it is possible to provide a semiconductor device which drastically eliminates constraints to manufacturing conditions, and which includes an InGaAlN-based nitride semiconductor layer which is inexpensive and has excellent electric characteristic as a channel.

DESCRIPTION OF EMBODIMENTS

Figure 1:
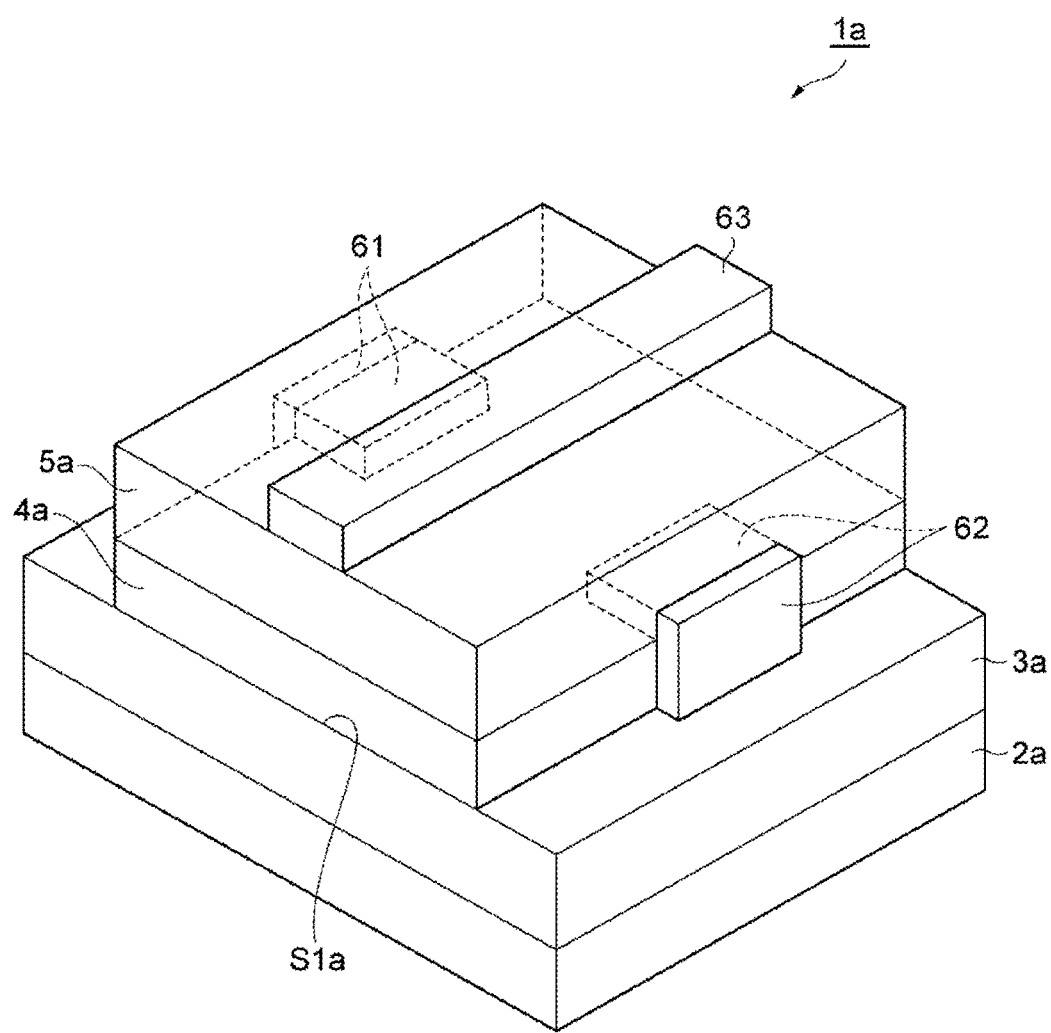
FIG. 1 is a diagram for explaining a configuration of a transistor (semiconductor device) according to a first embodiment.

Preferred embodiments of a semiconductor device according to the present invention will be described below with reference to the drawings. It should be noted that, in the description of the drawings, the same reference numerals will be assigned to the same components, if possible, and overlapped explanation will be omitted.

First Embodiment: InN Layer

FIG. 1 illustrates a configuration of a transistor 1a (semiconductor device) according to a first embodiment. The transistor 1a includes a substrate 2a, a first insulating layer 3a, a nitride semiconductor layer 4a, a second insulating layer 5a, a source electrode 61, a drain electrode 62 and a gate electrode 63.

The first insulating layer 3a, the nitride semiconductor layer 4a and the second insulating layer 5a are sequentially provided on a principal surface S1a of the substrate 2a. The first insulating layer 3a is bonded to the substrate 2a. The nitride semiconductor layer 4a is bonded to the first insulating layer 3a. The second insulating layer 5a is bonded to the nitride semiconductor layer 4a.

In the example illustrated in FIG. 1, the substrate 2a has insulation properties. The substrate 2a is a fused silica substrate. It should be noted that while the substrate 2a does not have to be an insulating substrate, and may be a substrate having conductive properties, when the nitride semiconductor layer 4a is directly formed on the substrate 2a, it is preferable to provide an insulating film on a surface of the substrate 2a.

While the substrate 2a may be a single crystalline substrate, because, typically, the single crystalline substrate is expensive, the substrate 2a may be a non-single crystalline substrate which is less expensive. As will be described later, in the present invention, because the InGaAlN-based nitride semiconductor layer which is the nitride semiconductor layer 4a is a polycrystalline or amorphous film having a film thickness falling within a specific range, a single crystalline substrate does not have to be necessarily used. It should be noted that the substrate 2a does not have to be a so-called "crystalline" substrate, and only has to be a substrate which allows film formation through a method which will be described later, and may be a plastic substrate, or the like.

The first insulating layer 3a functions as a foundation layer of the nitride semiconductor layer 4a, and, for example, is a layer having a thickness between 1 nm and 20 nm. Examples of the first insulating layer 3a can include an amorphous $HfO_2$ layer, an $Al_2O_3$ layer, a $SiO_2$ layer, or the like. Because the InGaAlN-based nitride semiconductor exhibits characteristics such as high wettability with respect to the surfaces of these insulating layers, by providing the above-described insulating layer, nucleus generation density is increased, so that it becomes possible to form a flat and high-quality polycrystalline or amorphous InGaAlN-based nitride semiconductor layer. It should be noted that when wettability of the InGaAlN-based nitride semiconductor with respect to the surface of the substrate 2a is sufficiently high, even if the InGaAlN-based nitride semiconductor layer is directly formed on a surface of such a substrate, it is possible to obtain a flat and high-quality InGaAlN-based nitride semiconductor layer.

In the present embodiment, the nitride semiconductor layer 4a is an InN layer provided on the substrate 2a, and this InN layer is a polycrystalline or amorphous film having a film thickness between 1 nm and 10 nm. It should be noted that, in the aspect illustrated in FIG. 1, a planar shape of the nitride semiconductor layer 4a is, for example, a rectangle of approximately, 50 μm×5 μm to 50 μm×10 μm.

While "amorphous" means, in a more limited sense, a material state which does not have long-range order as in a crystal, but has short-range order, in the present specification, amorphous also includes "cryptocrystalline" which does not have a complete crystal structure, but exhibits weak diffraction in X-ray analysis. Further, the amorphous film includes even an amorphous film which microscopically includes a microcrystal.

The nitride semiconductor layer 4a which is a group III-V compound semiconductor may have either group V polarity (N polarity) or group III polarity. The nitride semiconductor layer 4a can contain impurities (for example, Zn) as a dopant. Further, even a layer containing light element such as oxygen as impurities is the nitride semiconductor layer 4a.

A film thickness of the nitride semiconductor layer 4a is between 1 nm and 10 nm. As described above, it is conventionally considered that if the film thickness of the InN is made thinner, electric characteristics such as mobility becomes poorer, there is no idea of trying to manufacture a transistor using an extremely thin film of several nanometers as a channel layer. However, the present inventors have studied characteristics of the InN layer in the case where the thickness of the InN layer is made extremely thin, and have reached a conclusion that when the thickness of the InN layer falls within the above-described thickness range, even a polycrystalline or amorphous film can exhibit electric characteristics equal to a single crystalline film, and can realize favorable transistor operation, and thus, have made the present invention.

Figure 2:
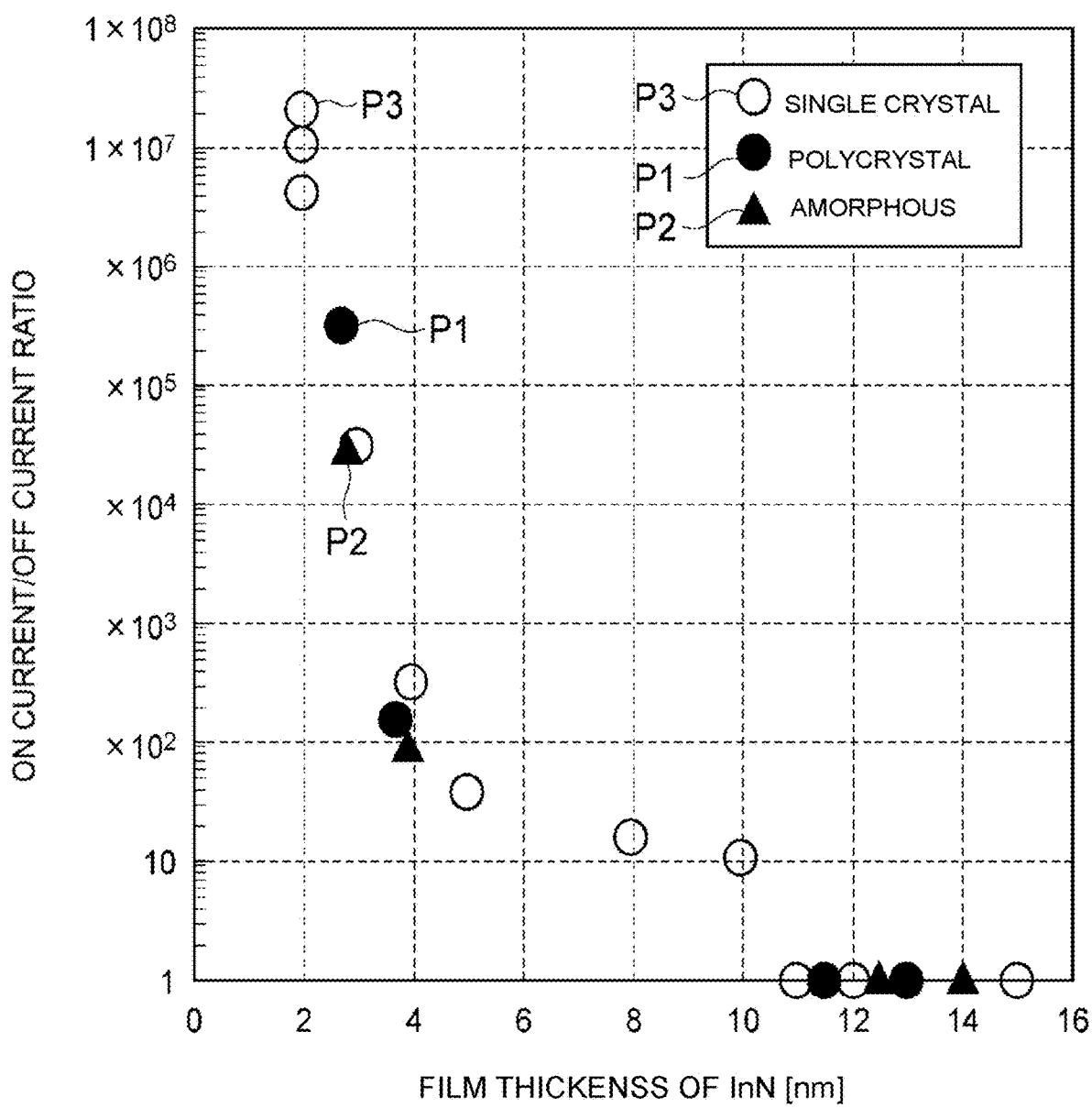
FIG. 2 is a diagram illustrating dependency on a film thickness of InN of a ratio between an ON current and an OFF current of a field effect transistor using an InN layer as a channel.

FIG. 2 is a diagram illustrating dependency of a film thickness dependency of InN of a ratio between an ON current and an OFF current of a field effect transistor which uses the InN layer as a channel, the film thickness dependency being obtained through experiments by the present inventors. FIG. 2 indicates a film thickness [nm] on a horizontal axis and indicates the ON current/OFF current ratio on a vertical axis.

A measurement result indicated with P1 in FIG. 2 is a result in the case where the nitride semiconductor layer 4a is polycrystalline InN, a measurement result indicated with P2 in FIG. 2 is a result in the case where the nitride semiconductor layer 4a is amorphous InN, and a measurement result indicated with P3 in FIG. 2 is a result in the case where the nitride semiconductor layer 4a is single crystalline InN.

Referring to FIG. 2, it can be understood that a favorable ON current/OFF current ratio of the nitride semiconductor layer 4a between approximately 10 and $10^8$ can be realized in the range where the film thickness of the InN layer which is the nitride semiconductor layer 4a is between 1 nm and 10 nm. Further, when the film thickness of the nitride semiconductor layer 4a is thinner within the range between 1 nm and 10 nm, the ON current/OFF current ratio becomes more favorable. The above-described tendency does not depend on whether the InN layer which is the nitride semiconductor layer 4a is a single crystal, a polycrystal or amorphous. That is, by designing the film thickness of the InN layer which is the nitride semiconductor layer 4a in the range between 1 nm and 10 nm, even when the InN layer is a polycrystal or amorphous, it is possible to obtain electric characteristics equal to those of a single crystal.

It should be noted that such an InN layer is favorably a film deposited through a sputtering method because it is easy to form a film at a relatively low temperature. More preferably, the InN layer is a film deposited through a pulsed sputtering deposition method (PSD method) which has high flexibility in setting of film forming conditions. Further, because when a film is formed at a higher temperature, a size of individual grains becomes larger, which makes it difficult to obtain a flat film, it is preferable to form a film at a temperature less than 600° C.

While, in order to form a film of a single crystalline InN layer, it is necessary to make a diffusion length of an atom on a film formation surface sufficiently long, which inevitably requires to form a film at a relatively high temperature, in the present invention, because the InN layer does not have to be a single crystal if the film thickness falls within a range between 1 nm and 10 nm, it is possible to obtain an advantage that there is no obstacle even when a film formation temperature is set low.

In addition, typically, a light element such as oxygen is likely to be incorporated into a film as impurities under the influence of remaining gas within a chamber when a film is formed through the sputtering method, and, if the InN layer is a single crystal, there is a problem that such oxygen impurities act as a donor. However, if the InN layer is a polycrystal or amorphous, because oxygen impurities are incorporated into the InN layer in a state where the oxygen impurities are electrically inactive by, for example, being trapped in a grain boundary, it is possible to obtain an advantage that the oxygen impurities are less likely to act as a donor as described above.

As with the first insulating layer 3a, examples of the second insulating layer 5a can include an amorphous $HfO_2$ layer, an $Al_2O_3$ layer, a $SiO_2$ layer, or the like. As described above, because InN has high wettability with respect to the surfaces of these insulating layers, InN has an effect of suppressing occurrence of a defect at an interface with the InN layer. It should be noted that the second insulating layer 5a is, for example, a layer having a thickness between approximately 1 nm and 100 nm.

In the example illustrated in FIG. 1, thicknesses of the source electrode 61, the drain electrode 62 and the gate electrode 63 are all approximately 50 nm, and materials of the source electrode 61, the drain electrode 62 and the gate electrode 63 are all, for example, Au. Both the source electrode 61 and the drain electrode 62 are bonded to the nitride semiconductor layer 4a and the second insulating layer 5a. The gate electrode 63 is provided on a surface of the second insulating layer 5a and bonded to the second insulating layer 5a.

A manufacturing method of the transistor 1a will be described next. A wafer corresponding to the substrate 2a is prepared. On a surface of this wafer, the first insulating layer 3a, the nitride semiconductor layer 4a and the second insulating layer 5a are laminated in this order. It should be noted that layers corresponding to the first insulating layer 3a and the second insulating layer 5a may both be layers made of an oxide semiconductor.

If the first insulating layer 3a and the second insulating layer 5a are oxide semiconductors, these layers are both formed through, for example, an atomic layer deposition method (ALD method). An oxygen material when a film is formed through the ALD method is $H_2O$, a deposition temperature is approximately 200° C., and a deposition period is approximately one and a half hours.

The InN layer corresponding to the nitride semiconductor layer 4a is formed through the pulsed sputtering deposition method (PSD method). A deposition rate of the InN layer is approximately 1 nm/min, and the thickness is set within a range between 1 nm and 10 nm. When the deposition temperature of the InN layer depends on the sputtering method, the temperature is room temperature in the case of an amorphous film, and approximately between 300° C. and 500° C. in the case of a polycrystal. That is, the temperature is lower than a typical crystal growth temperature (600° C. or higher) in the case where a film of a single crystalline InN layer is formed.

While a film of the InN layer corresponding to the nitride semiconductor layer 4a may be formed through the sputtering method other than the PSD method, and may be formed through other evaporation methods or a thin film formation methods such as an MBE method and an MOCVD method, the sputtering method is favorable because it is easy to form a film whose composition is uniform at a relatively low temperature. It should be noted that, as described above, because a size of individual grains become larger when a film of a polycrystalline nitride semiconductor layer 4a is formed at a higher temperature, which makes it difficult to obtain a flat film, it is preferable to form a film at a temperature of less than 600° C.

Contact holes respectively corresponding to the source electrode 61 and the drain electrode 62 are formed on the second insulating layer 5a using lithography technique. Both the source electrode 61 and the drain electrode 62 are formed through lithography after, for example, Au is vacuum evaporated. The gate electrode 63 is formed by patterning Au vacuum evaporated on a surface of the second insulating layer 5a through a lift-off method.

In this manner, the first insulating layer 3a, the nitride semiconductor layer 4a and the second insulating layer 5a are laminated on a surface of the wafer corresponding to the substrate 2a in this order, and separated into chips corresponding to the transistor 1a after the source electrode 61, the drain electrode 62 and the gate electrode 63 are formed. The transistor 1a is manufactured through the above-described manufacturing method.

Transistor characteristics of the transistor 1a which uses the above-described InN layer as a channel will be described next with reference to FIGS. 3 to 5.

Figure 3:
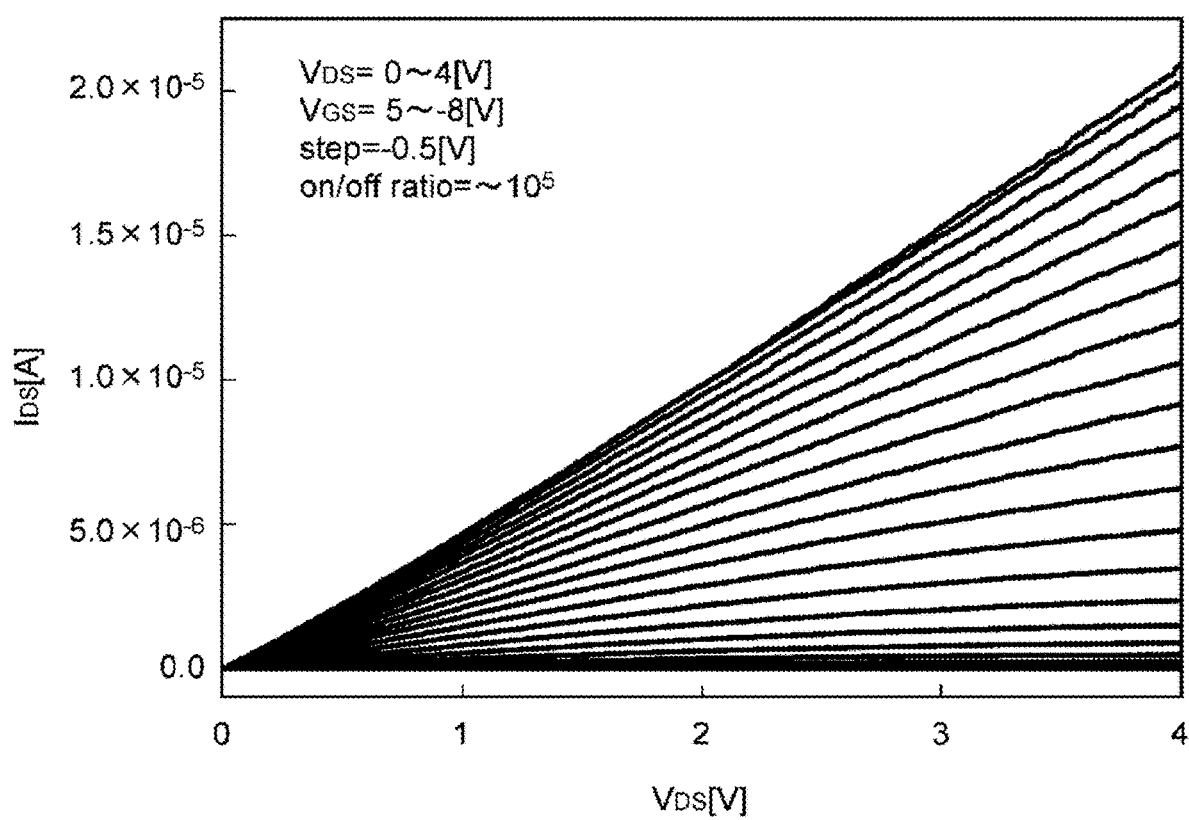
FIG. 3 is a diagram illustrating $I_{DS}$-$V_{DS}$ characteristics of a transistor in the case where the nitride semiconductor layer is a polycrystalline InN layer.

FIG. 3 illustrates $I_{DS}$-$V_{DS}$ characteristics of the transistor 1a in the case where the nitride semiconductor layer 4a is a polycrystalline InN layer. Here, $I_{DS}$ indicates a current flowing between a drain and a source, $V_{DS}$ is a voltage between the drain and the source. FIG. 3 indicates $V_{DS}$ [V] on a horizontal axis and indicates $I_{DS}$ [A] on a vertical axis.

The result illustrated in FIG. 3 is $I_{DS}$-$V_{DS}$ characteristics in the case where $V_{GS}$ which is a voltage between the gate and the source is changed in a step of −0.5 [V] within a range between 5 [V] and −8[V]. The ON current/OFF current ratio is approximately $10^5$. FIG. 3 illustrates an aspect where $I_{DS}$ approaches zero as $V_{GS}$ decreases. Therefore, referring to FIG. 3, it can be understood that it is sufficiently possible to switch the ON current/OFF current ratio of the transistor 1a by controlling $V_{GS}$ in the case of the polycrystalline InN.

Figure 4:
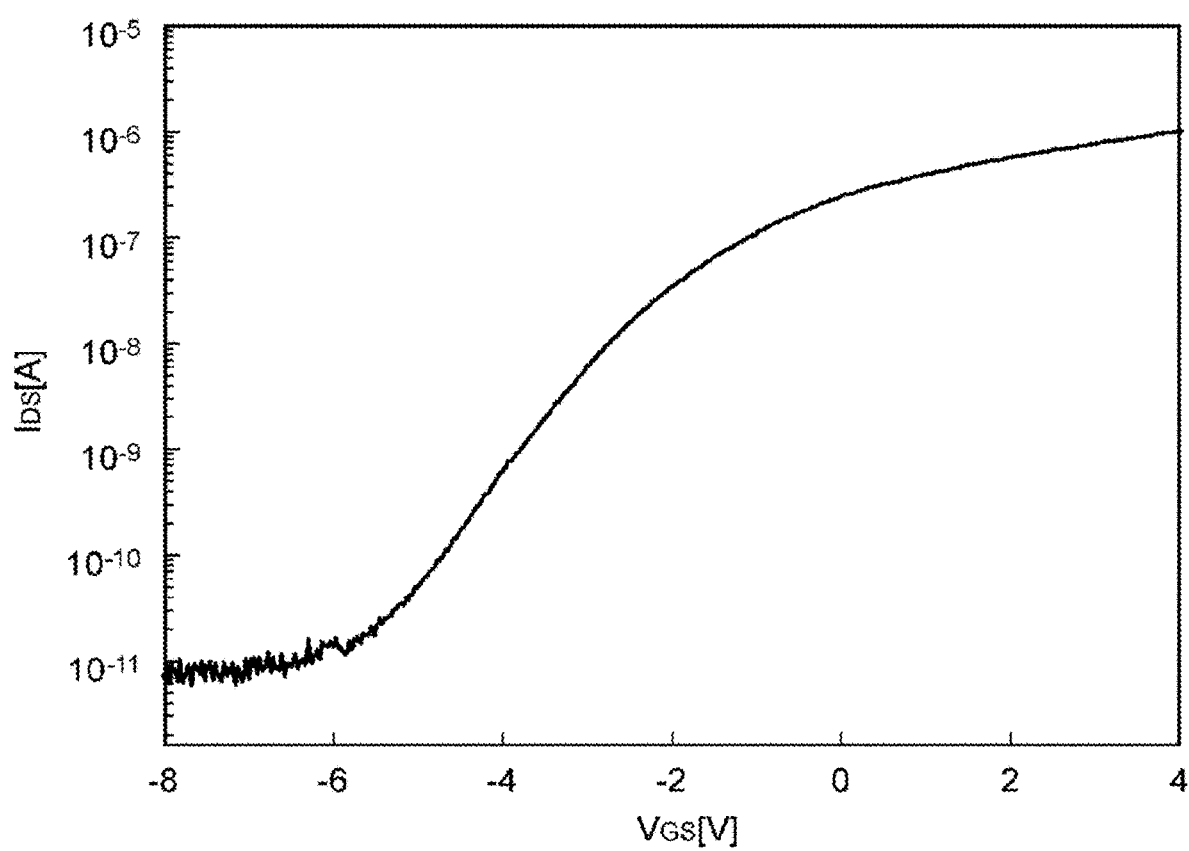
FIG. 4 is a diagram illustrating $I_{DS}$-$V_{GS}$ characteristics of the transistor in the case where the nitride semiconductor layer is a polycrystalline InN layer.

FIG. 4 illustrates $I_{DS}$-$V_{GS}$ characteristics of the transistor 1a in the case where the nitride semiconductor layer 4a is the polycrystalline InN layer. FIG. 4 indicates $V_{GS}$ [V] on a horizontal axis and indicates $I_{DS}$ [A] on a vertical axis.

According to the result illustrated in FIG. 4, it can be understood that as $V_{GS}$ decreases within a range between 4 [V] and −8 [V], $I_{DS}$ also decreases, and a ratio between a value of $I_{DS}$ when $V_{GS}$ is 4 [V] and a value of $I_{DS}$ when $V_{GS}$ is −8 [V] is approximately $10^5$. Therefore, referring to FIG. 4, it can be understood that it is sufficiently possible to control $I_{DS}$ of the transistor 1a by controlling $V_{GS}$ in the case of the polycrystalline InN.

Figure 5:
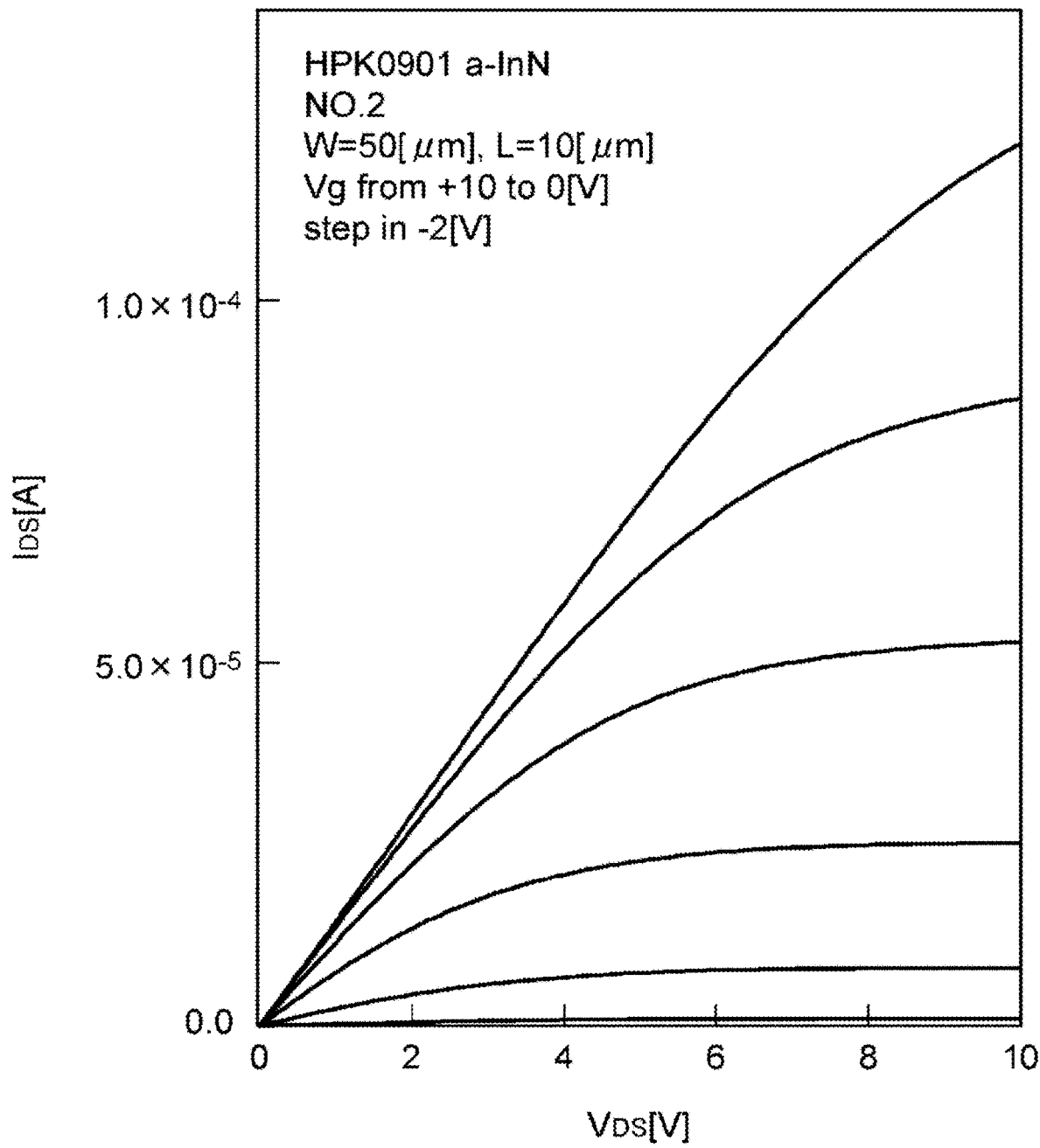
FIG. 5 is a diagram illustrating $I_{DS}$-$V_{DS}$ characteristics of the transistor in the case where the nitride semiconductor layer is an amorphous InN layer.

FIG. 5 illustrates $I_{DS}$-$V_{DS}$ characteristics of the transistor 1a in the case where the nitride semiconductor layer 4a is an amorphous InN layer. FIG. 5 indicates $V_{DS}$ [V] on a horizontal axis and indicates $I_{DS}$ [A] on a vertical axis.

The result illustrated in FIG. 5 indicates $I_{DS}$-$V_{DS}$ characteristics when $V_{GS}$ is changed in a step of −2 [V] within a range between 10 [V] and 0 [V]. FIG. 5 illustrates that as $V_{GS}$ decreases, $I_{DS}$ also approaches zero. Therefore, referring to FIG. 5, it can be understood that it is sufficiently possible to switch the ON current/OFF current ratio of the transistor 1a by controlling $V_{GS}$ in the case of the amorphous InN.

Second Embodiment: InN Layer

Figure 6:
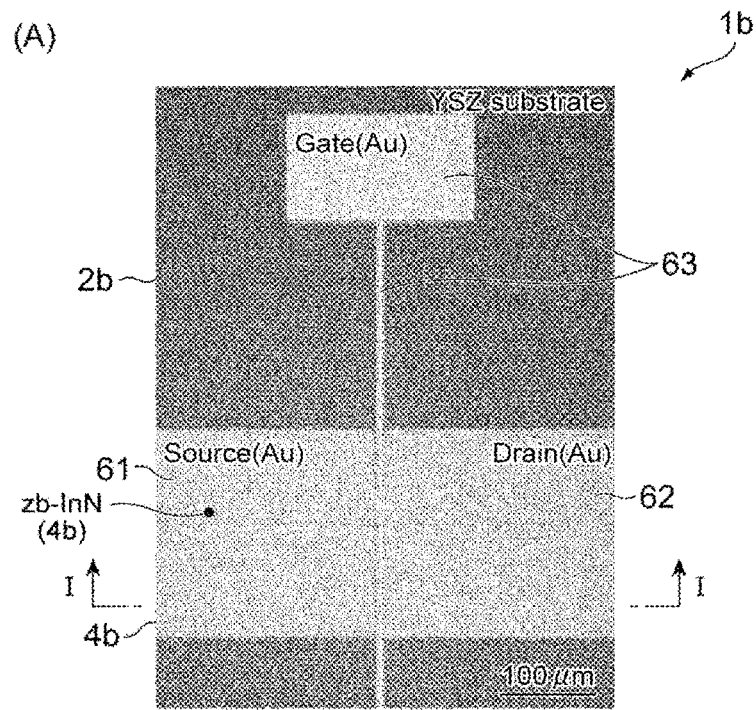
FIG. 6 is a diagram for explaining one aspect of a configuration of a transistor (semiconductor device) according to a second embodiment.
Figure 6:
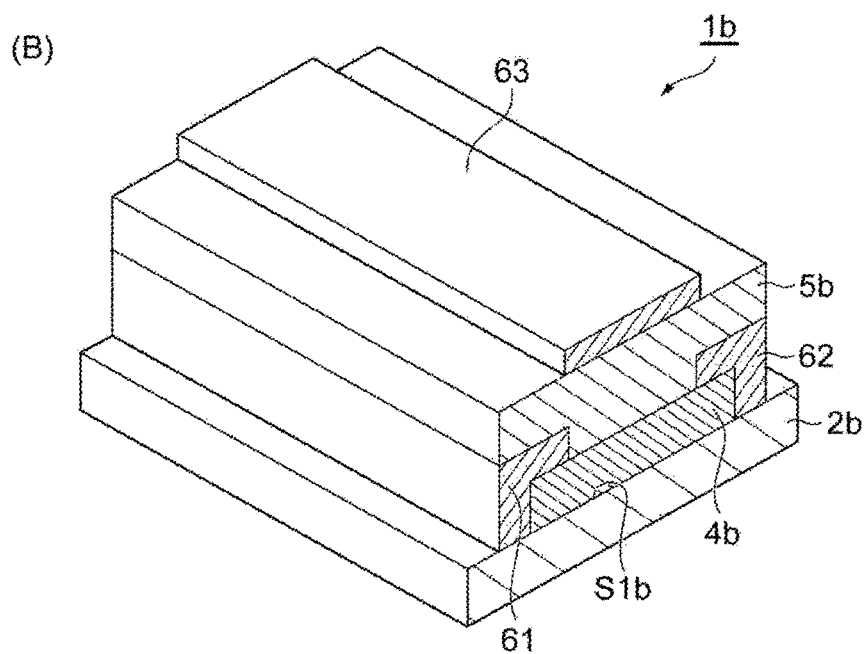
Figure 7:
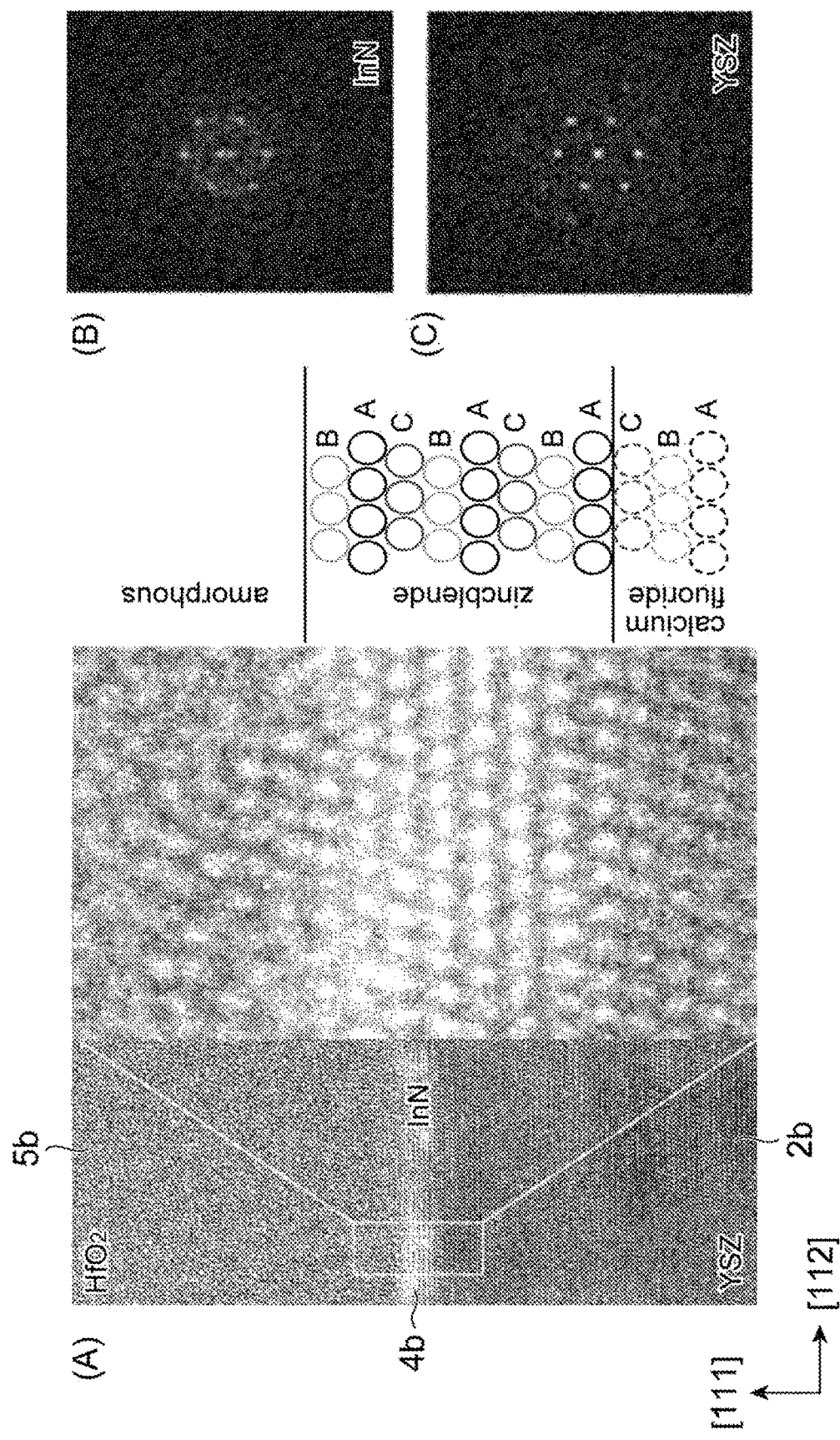
FIG. 7 is a diagram for explaining one aspect of the configuration of the transistor (semiconductor device) according to the second embodiment.

FIGS. 6 and 7 are diagrams for explaining one aspect of a configuration of a transistor 1b (semiconductor device) according to a second embodiment. It should be noted that, also in the present embodiment, a nitride semiconductor layer 4b is an InN layer provided on a substrate 2b.

FIG. 6(A) is an optical microscope image illustrating a planar shape of the transistor 1b, and FIG. 6(B) is a diagram mainly illustrating a configuration of a cross-section of the transistor 1b along line I-I illustrated in FIG. 6(A).

FIG. 7(A) is a TEM (Transmission Electron Microscope) lattice image illustrating a laminate structure of the transistor 1b, FIG. 7(B) illustrates an electron diffraction pattern (Fourier transformed image of the TEM image) from a region indicated with InN in FIG. 7(A), and FIG. 7(C) is an electron diffraction pattern (Fourier transformed image of the TEM image) from a region indicated with YSZ in FIG. 7(A). It can be confirmed from FIGS. 7(A) to 7(C) that a single crystalline InN as the nitride semiconductor layer is epitaxially grown on a single crystalline YSZ substrate.

The transistor 1b includes the substrate 2b, a nitride semiconductor layer 4b, an insulating layer 5b, a source electrode 61, a drain electrode 62 and a gate electrode 63. The nitride semiconductor layer 4b and the insulating layer 5b are sequentially provided on a principal surface S1b of the substrate 2b.

In the present embodiment, the substrate 2b is an yttria-stabilized zirconia substrate (YSZ substrate). The YSZ substrate has relatively small in-plane lattice mismatch with not only InN but also nitride semiconductors such as InGaN, InAlN and InAlGaN which includes InN as a main component. The principal surface S1b of the substrate 2b is bonded to the nitride semiconductor layer 4b and has plane indices (111). The principal surface S1b is made flat at the atomic level.

The InN layer as the nitride semiconductor layer 4b is provided on the substrate 2b. The nitride semiconductor layer 4b is bonded to the substrate 2b. The nitride semiconductor layer 4b is a single crystal. The nitride semiconductor layer 4b is an epitaxial layer formed through epitaxial growth from the principal surface S1b of the substrate 2b. The nitride semiconductor layer 4b can have any of N-polarity and group III polarity. The nitride semiconductor layer 4b can contain impurity Zn (zinc). The planar shape of the nitride semiconductor layer 4b is, for example, a rectangle of approximately 50 μm×5 μm to 50 μm×10 μm.

The film thickness of the InN layer which is the nitride semiconductor layer 4b falls between 1 nm and 10 nm. As already described with reference to FIG. 2, in the range where the film thickness of the InN layer which is the nitride semiconductor layer falls between 1 nm and 10 nm, the ON current/OFF current ratio of the nitride semiconductor layer is between approximately 10 and $10^8$, so that it is possible to realize a favorable ON current/OFF current ratio. Further, as the film thickness of the nitride semiconductor layer is thinner within a range between 1 nm and 10 nm, the ON current/OFF current ratio becomes more favorable. In addition, the above-described tendency does not depend on whether the InN layer which is the nitride semiconductor layer is a single crystal, a polycrystal or amorphous.

Therefore, in the present embodiment, while the InN layer which is the nitride semiconductor layer 4b is a single crystalline InN which is epitaxially grown on the single crystalline YSZ substrate, even when the InN layer is a polycrystalline or amorphous InN layer deposited on a fused silica substrate, or the like, it is possible to obtain electric characteristics equal to those of a single crystal by designing the film thickness in a range between 1 nm and 10 nm.

The insulating layer 5b is bonded to the nitride semiconductor layer 4b. Examples of the insulating layer 5b can include an amorphous $HfO_2$ layer, an $Al_2O_3$ layer, a $SiO_2$ layer, or the like. As already described, because the InN has high wettability with respect to the surfaces of these insulating layers, it is possible to provide an effect of suppressing occurrence of a defect at an interface with the InN layer. It should be noted that the film thickness of the insulating layer 5b is, for example, between 1 nm and 100 nm.

In the example illustrated in FIG. 6, the thicknesses of the source electrode 61, the drain electrode 62 and the gate electrode 63 are all approximately 50 nm, and materials of the source electrode 61, the drain electrode 62 and the gate electrode 63 are all, for example, Au. Both the source electrode 61 and the drain electrode 62 are bonded to the nitride semiconductor layer 4b and the insulating layer 5b. The gate electrode 63 is provided on the surface of the insulating layer 5b and bonded to the insulating layer 5b.

A manufacturing method of the transistor 1b will be described next. A wafer corresponding to the substrate 2b is prepared. While, in the present embodiment, this wafer is a YSZ substrate, if a polycrystalline or amorphous InN layer is formed, this wafer may be a non-single crystalline substrate or an insulating substrate (for example, a fused silica substrate). On the surface of this wafer, the nitride semiconductor layer 4b and the insulating layer 5b are laminated in this order.

The InN layer corresponding to the nitride semiconductor layer 4b is formed through the pulsed sputtering deposition method (PSD method) as in the first embodiment. A deposition rate of the InN layer is approximately 1 nm/min, and the thickness is set in a range between 1 nm and 10 nm. Because, in the present embodiment, a single crystalline InN is formed, an epitaxial temperature is between 600° C. and 700° C. However, if an amorphous InN is deposited through the sputtering method, the deposition temperature is made an ambient temperature, while, if a polycrystalline InN is deposited, the deposition temperature is made between approximately 300° C. and 500° C. That is, the deposition temperature is lower than a typical crystal growth temperature (600° C. or higher) in the case where a film of a single crystalline InN layer is formed.

While a film of the InN layer corresponding to the nitride semiconductor layer 4b may be formed through the sputtering method other than the PSD method, and may be formed through other evaporation methods or a thin film formation method such as an MBE method and an MOCVD method, the sputtering method is favorable because it is easy to form a film whose composition is uniform at a relatively low temperature. It should be noted that, as described above, a size of individual grains becomes larger as the film is formed at a higher temperature, which makes it difficult to obtain a flat film, a film of a polycrystalline nitride semiconductor layer 4a is preferably formed at a temperature of less than 600° C.

When the insulating layer 5b is an oxide semiconductor, for example, a film is formed through an atomic layer deposition method (ALD method). An oxygen material when the film is formed through the ALD method is $H_2O$, the deposition temperature is 200° C., and a deposition period is approximately one and a half hours.

Contact holes respectively corresponding to the source electrode 61 and the drain electrode 62 are formed in the insulating layer 5b using lithography technique. Both the source electrode 61 and the drain electrode 62 are formed through lithography after, for example, Au is vacuum evaporated. The gate electrode 63 is formed by patterning Au which is vacuum evaporated on a surface of the insulating layer 5b using a lift-off method.

In this manner, on the surface of the wafer corresponding to the substrate 2b, the nitride semiconductor layer 4b and the insulating layer 5b are laminated in this order, and separated into chips corresponding to the transistor 1b after the source electrode 61, the drain electrode 62 and the gate electrode 63 are formed. The transistor 1b is manufactured through the above-described manufacturing method.

Figure 8:
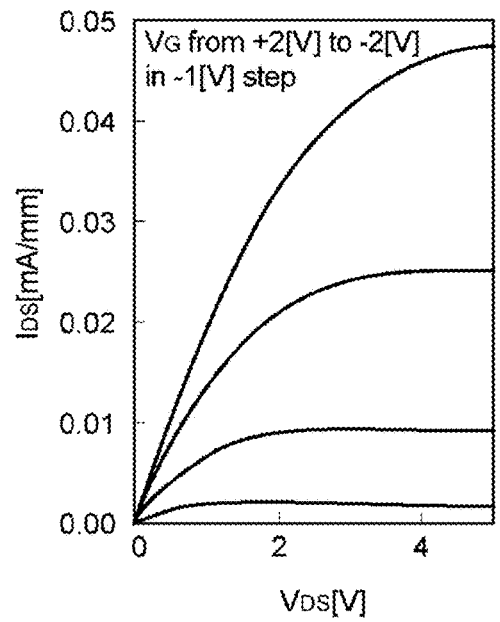
FIGS. 8(A) and 8(B) are graphs illustrating $I_{DS}$-$V_{DS}$ characteristics and $I_{DS}$-$V_{GS}$ characteristics of the transistor in the case where the nitride semiconductor layer is a single crystalline InN layer having a film thickness of 2 nm.
FIGS. 8(C) and 8(D) are graphs illustrating $I_{DS}$-$V_{DS}$ characteristics and $I_{DS}$-$V_{GS}$ characteristics of the transistor in the case where the nitride semiconductor layer is a single crystalline InN layer having a film thickness of 5 nm.
Figure 8:
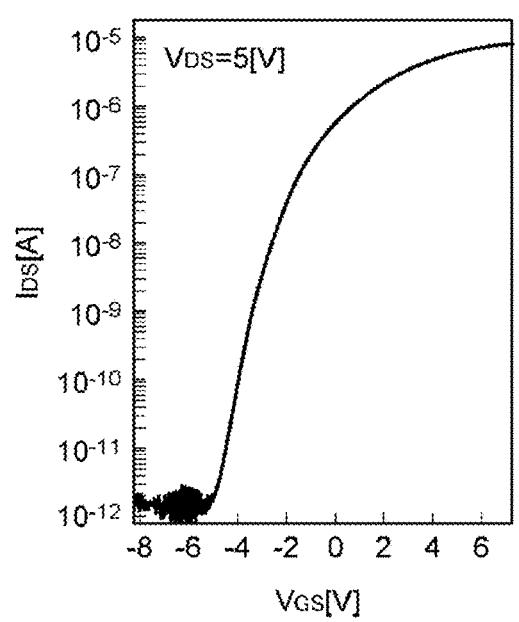
Figure 8:
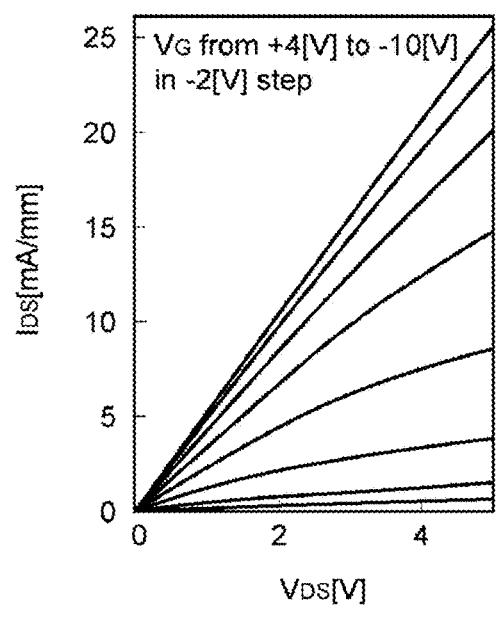
Figure 8:
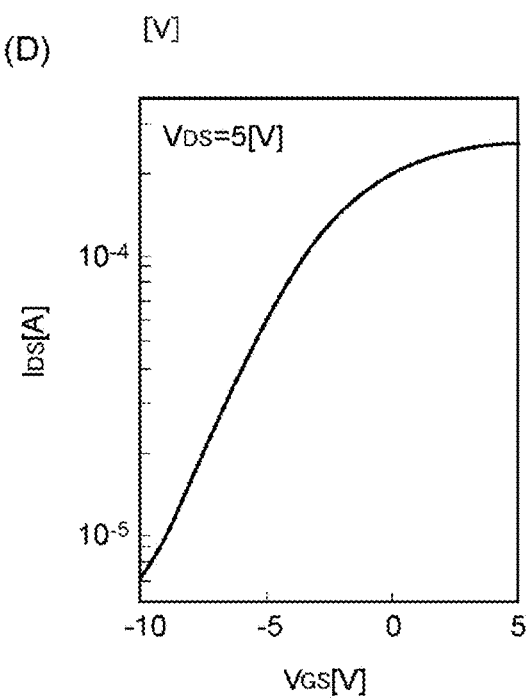

Transistor characteristics of the transistor 1b which uses the above-described InN layer as a channel will be described next with reference to FIG. 8.

FIGS. 8(A) and 8(B) illustrate $I_{DS}$-$V_{DS}$ characteristics (FIG. 8(A)) in the case where $V_{GS}$ of the transistor 1b in the case where the nitride semiconductor layer 4b is a single crystalline InN layer having a film thickness of 2 nm, is changed in a step of −1 [V] within a range between +2 [v] and −2 [V], and $I_{DS}$-$V_{GS}$ characteristics (FIG. 8(B)) under $V_{DS}$ of 5 [V]. FIG. 8(A) indicates $V_{DS}$ [V] on a horizontal axis and indicates $I_{DS}$ [mA/mm] on a vertical axis. Further, FIG. 8(B) indicates $V_G$ [V] on a horizontal axis and indicates $I_{DS}$ [A] on a vertical axis.

FIGS. 8(C) and 8(D) illustrate $I_{DS}$-$V_{DS}$ characteristics (FIG. 8(C)) in the case where $V_{GS}$ of the transistor 1b in the case where the nitride semiconductor layer 4b is a single crystalline InN layer having a film thickness of 5 nm, is changed in a step of −2 [V] within a range between +4 [V] and −10 [V], and $I_{DS}$-$V_{GS}$ characteristics (FIG. 8(D)) under $V_{DS}$ of 5 [V]. FIG. 8(C) indicates $V_{DS}$ [V] on a horizontal axis, and indicates $I_{DS}$ [mA/mm] on a vertical axis. FIG. 8(D) indicates $V_G$ [V] on a horizontal axis and indicates $I_{DS}$ [A] on a vertical axis.

Referring to the results illustrated in FIGS. 8(A) to 8(D), it can be understood that it is sufficiently possible to switch the ON current/OFF current ratio of the transistor 1b by controlling $V_{GS}$ in the case of a single crystalline InN.

Further, as described above, even when the InN layer is a polycrystal or amorphous, by designing the film thickness within a range between 1 nm and 10 nm, it is possible to obtain electric characteristics equal to those of a single crystal. Therefore, even when the nitride semiconductor layer 4b is a polycrystalline or amorphous InN layer, it is sufficiently possible to switch the ON current/OFF current ratio of the transistor 1b.

While the principle of the present invention has been described in the preferred embodiments, a person skilled in the art would recognize that arrangement and details of the present invention can be modified without departing from such principle.

For example, the semiconductor device according to the present invention can be made a semiconductor device having a configuration including a laminate structure in which the nitride semiconductor layer having composition different from that of InN is bonded on at least one principle surface of the above-described InN layer, that is, a semiconductor device having a heterojunction structure.

The present invention is not limited to a specific configuration disclosed in the present embodiments. Therefore, all modifications and changes that result from the claims and the scope of its spirit are claimed. For example, the nitride semiconductor layers 4a and 4b of the present embodiments can be applied to semiconductor devices other than a transistor. In the case of the nitride semiconductor layer 4a, the first insulating layer 3a is also applied to such a semiconductor device along with the nitride semiconductor layer 4a.

Third Embodiment: InGaAlN Layer

In the above-described first and second embodiments, the nitride semiconductor layer is made an InN layer expressed with a general expression $In_xGa_yAl_zN$ (where x+y+z=1.0) where x=1. Further, it is clarified that, in the case of the InN layer, by setting the thickness within a specific thickness range, it is possible to obtain a "non-single crystalline" film exhibiting channel characteristics equal to those of a single crystal.

If desired electric characteristics can be obtained only within a specific thickness range (1 to 10 nm), there is a problem that flexibility of design of the semiconductor device cannot be secured. Therefore, the present inventors have further studied electric characteristics of an InGaAlN-based nitride semiconductor and found that even a "non-single crystalline film" exhibits channel characteristics equal to those of a single crystal if a composition range of the film falls within a specific composition range.

It has been conventionally considered that it is difficult to change the composition of In in the InGaAlN-based nitride semiconductor in a broad range in thermodynamic terms, because an ion radius of In in the InGaAlN-based nitride semiconductor is larger than those of other elements. However, such conventional knowledge is one that is applied to an InGaAlN-based nitride semiconductor obtained through a CVD method in which a film is formed at a relatively high temperature. The present inventors have pursued study based on idea that the above-described knowledge is one that is merely applied to the InGaAlN-based nitride semiconductor formed under a thermal equilibrium state, and if the InGaAlN-based nitride semiconductor is deposited through a sputtering method in which a film can be formed at a relatively low temperature, the film may be quenched while a state is kept a thermally non-equilibrium state, and film formation may stably proceed, thereby achieving the present invention.

In the following examples, a result of study as to how electric characteristics of the InGaAlN-based nitride semiconductor expressed with a general expression $In_xGa_yAl_zN$ (where x+y+z=1.0) depends on its composition will be described.

A field effect transistor 1a having a configuration illustrated in FIG. 1 was experimentally manufactured, and electric characteristics were evaluated with ratios between ON currents and OFF currents (ON/OFF ratios) and maximum current density of the transistor 1a while composition ($In_xGa_yAl_zN$) of the nitride semiconductor layer 4a which becomes a channel is variously changed. The substrate 2a is a fused silica substrate, the first insulating layer 3a is $HfO_2$ having a thickness of 20 nm, the second insulating layer 5a is $HfO_2$ which is also used as a gate insulating film and has a thickness of 20 nm. It should be noted that the substrate 2a may be a non-single crystalline substrate or an insulating substrate other than the fused silica substrate, and the first insulating layer 3a and the second insulating layer 5a may be an $Al_2O_3$ layer or a $SiO_2$ layer. Further, all transistors 1a have a gate length of 5 μm and a channel width of 50 μm.

All $In_xGa_yAl_zN$ layers are formed through the sputtering method (in the present embodiment, the PSD method). The deposition rate is approximately 1 nm/min. Further, the deposition temperature is made less than 600° C., and the $In_xGa_yAl_zN$ layers are made polycrystalline or amorphous $In_xGa_yAl_zN$ layers.

Figure 9:
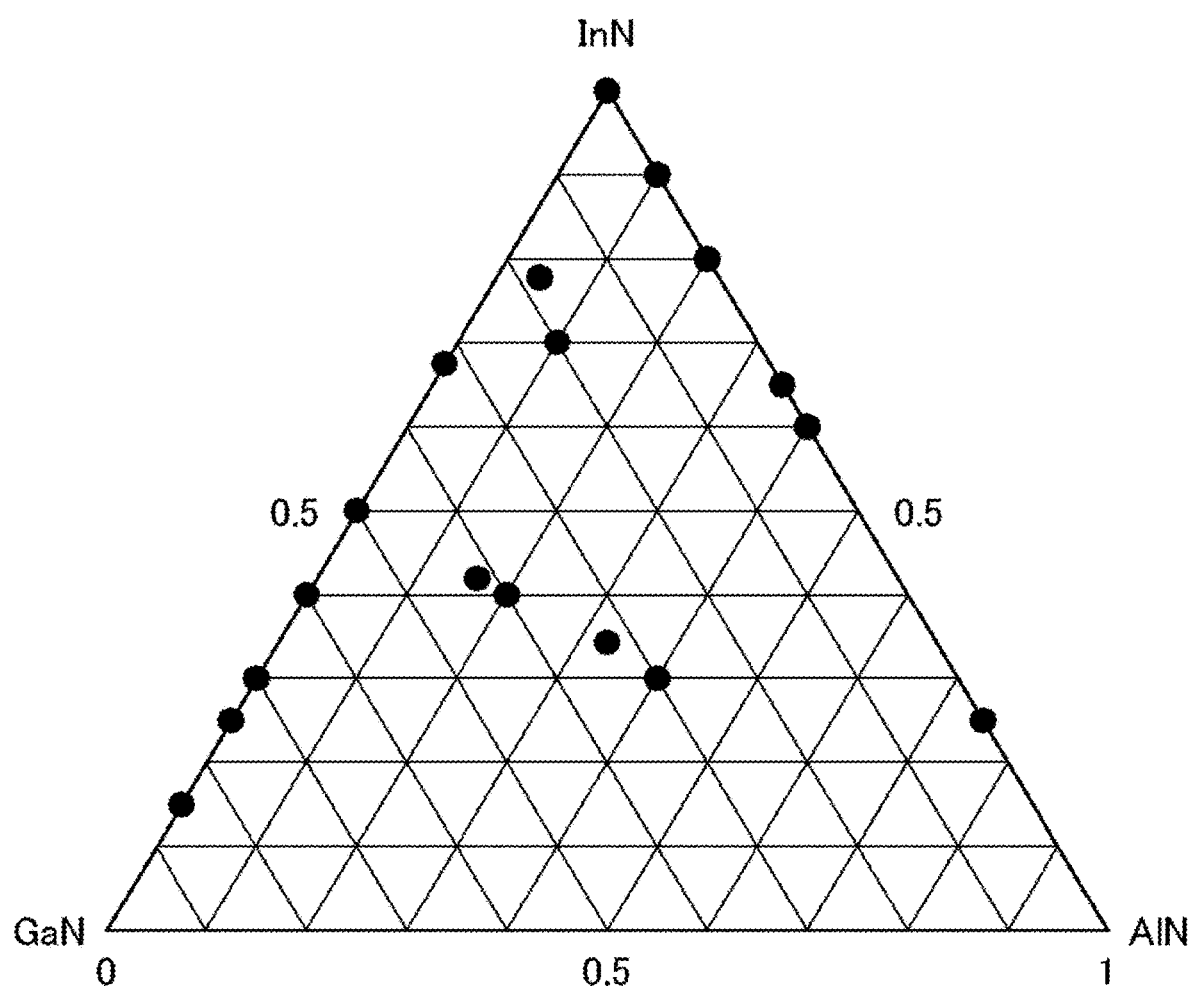
FIG. 9 is a diagram in which composition of a nitride semiconductor layer of an experimentally manufactured transistor is plotted in a ternary phase diagram of $In_xGa_yAl_zN$.

FIG. 9 is a diagram in which composition of the nitride semiconductor layer 4a of the transistor 1a which is experimentally manufactured is plotted in a ternary phase diagram of $In_xGa_yAl_zN$.

Figure 10:
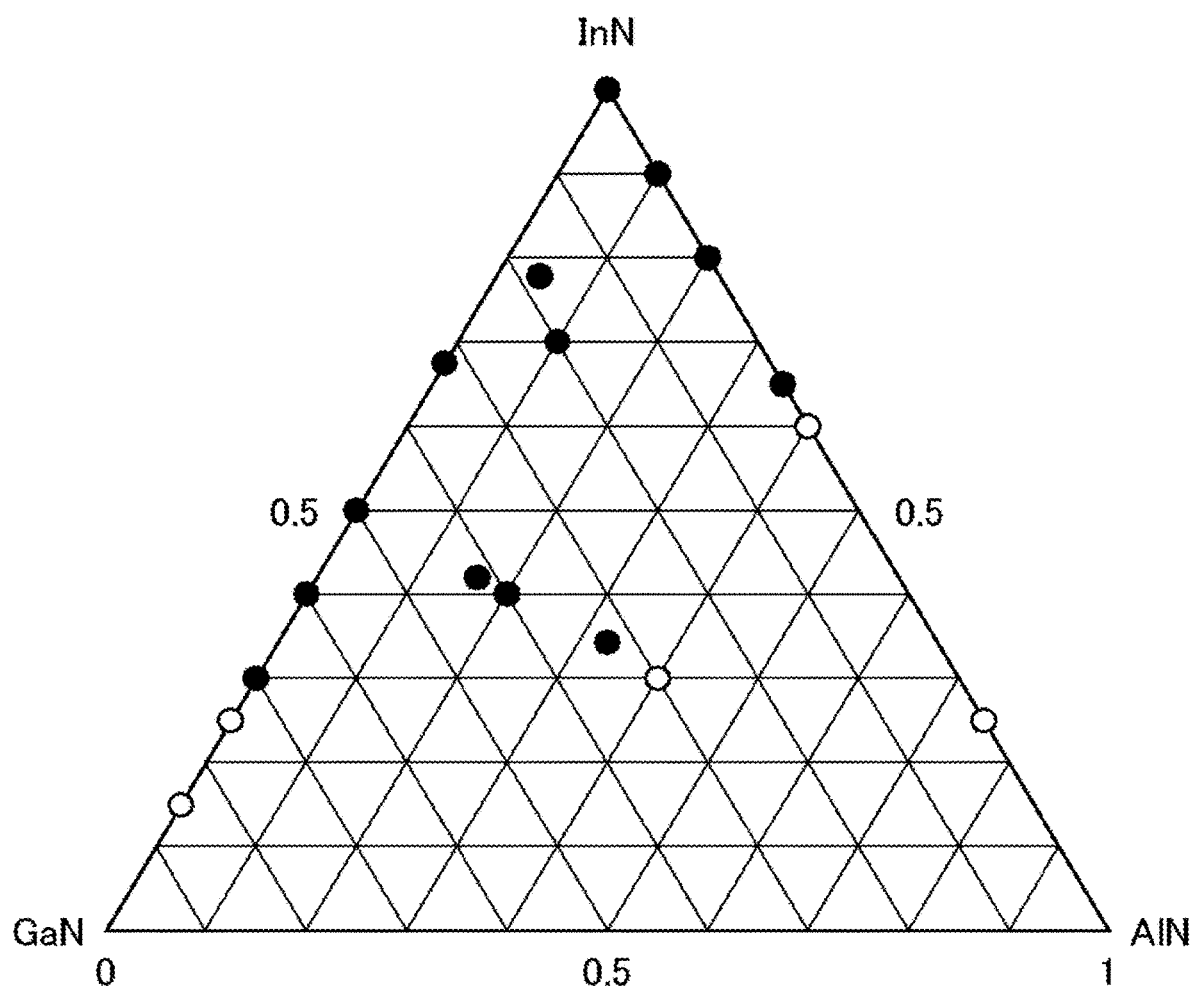
FIG. 10 is a diagram in which composition of a nitride semiconductor layer of a transistor exhibiting an ON/OFF ratio of $10^2$ or higher is plotted with "●" and composition of other nitride semiconductor layers is plotted with "○" in a ternary phase diagram of $In_xGa_yAl_zN$.

FIG. 10 is a diagram in which composition of the nitride semiconductor layer 4a of the transistor exhibiting an ON/OFF ratio of $10^2$ or higher is plotted with "●" and composition of other nitride semiconductor layer 4a is plotted with "○" in a ternary phase diagram of $In_xGa_yAl_zN$ among the composition illustrated in FIG. 9.

According to this result, when the composition expressed with a general expression $In_xGa_yAl_zN$ (where x+y+z=1.0) falls within a range of 0.3≤x≤1.0 and 0≤z<0.4, a transistor 1a exhibiting the ON/OFF ratio of $10^2$ or higher can be obtained.

Figure 11:
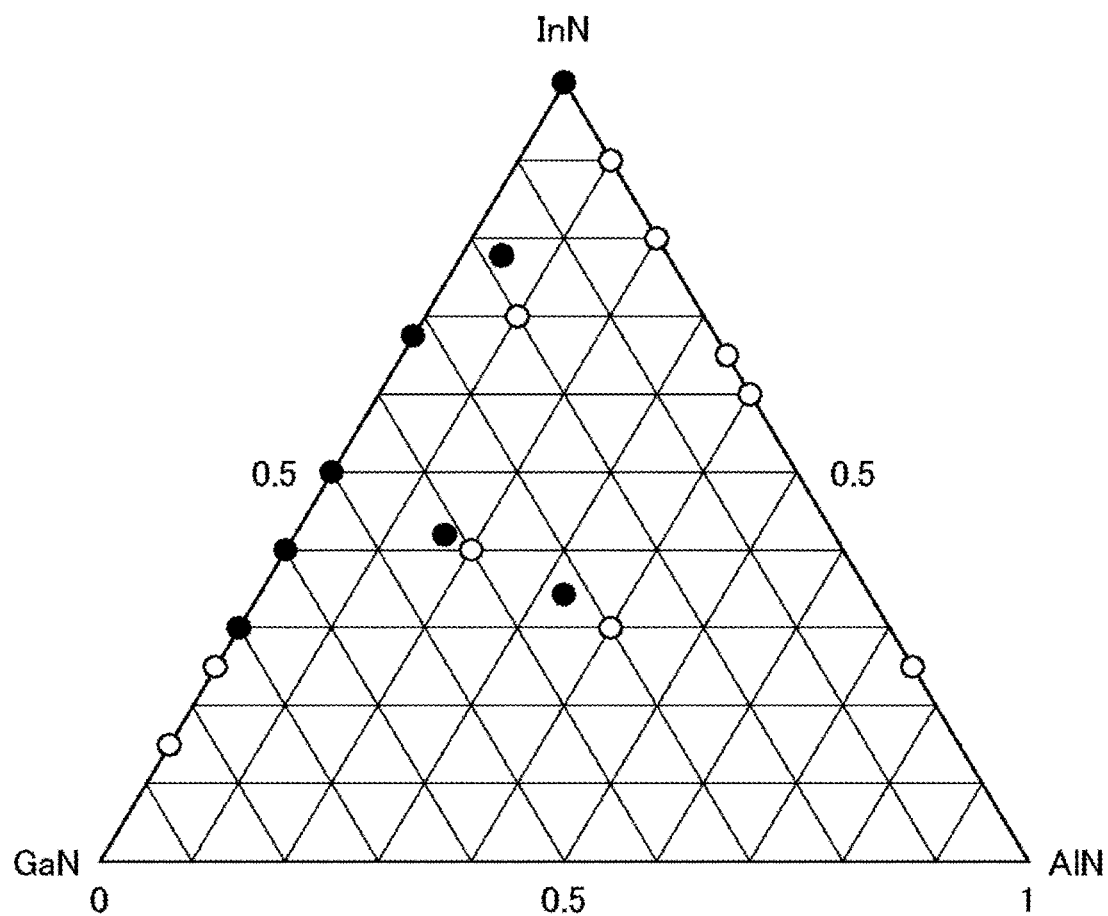
FIG. 11 is a diagram in which composition of a nitride semiconductor layer of a transistor exhibiting an on/off ratio of $10^3$ or higher is plotted with "●" and composition of other nitride semiconductor layers is plotted with "○" in a ternary phase diagram of $In_xGa_yAl_zN$.

Further, FIG. 11 is a diagram in which composition of the nitride semiconductor layer of a transistor exhibiting the ON/OFF ratio of $10^3$ or higher is plotted with "●" and composition of other nitride semiconductor layers is plotted with "○" in a ternary phase diagram of $In_xGa_yAl_zN$.

According to this result, when composition expressed with a general expression $In_xGa_yAl_zN$ (where x+y+z=1.0) falls within a range of 0.3≤x≤1.0 and 0≤z<0.4, a transistor 1a exhibiting the ON/OFF ratio of $10^2$ or higher can be obtained.

Figure 12:
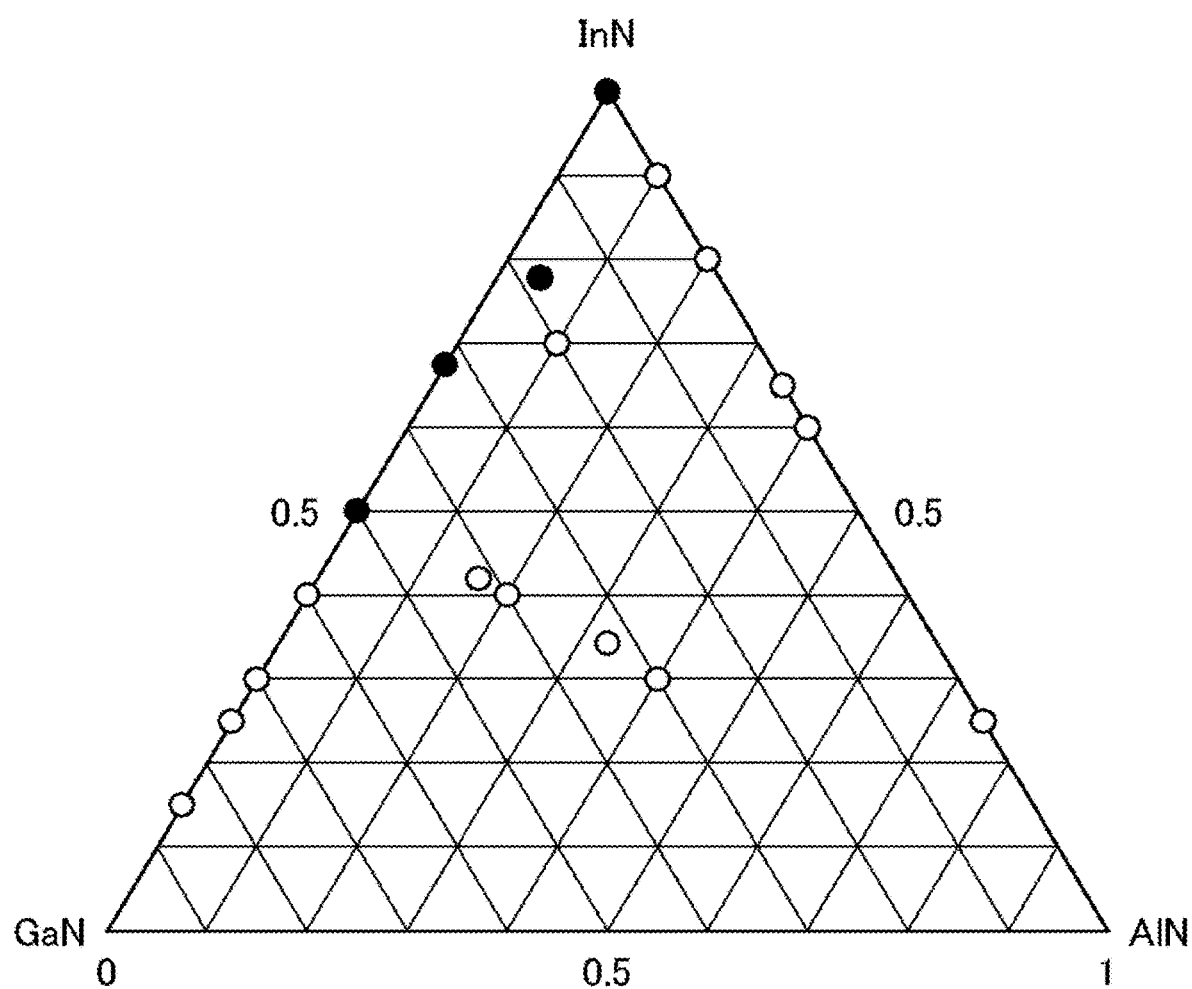
FIG. 12 is a diagram in which composition of a nitride semiconductor layer having transistor characteristics exhibiting maximum current density exceeding 5 mA/mm is plotted with "●", and composition of other nitride semiconductor layers is plotted with "○" in a ternary phase diagram of $In_xGa_yAl_zN$.

Further, FIG. 12 is a diagram in which composition of a nitride semiconductor layer having transistor characteristics exhibiting maximum current density exceeding 5 mA/mm is plotted with "●" and composition of other nitride semiconductor layers is plotted with "○" in a ternary phase diagram of $In_xGa_yAl_zN$.

According to this result, when composition expressed with a general expression $In_xGa_yAl_zN$ (where x+y+z=1.0) falls within a range of 0.5≤x≤1.0 and 0≤z<0.1, transistor characteristics exhibiting the maximum current density exceeding 5 mA/mm can be obtained.

As described above, when composition of the nitride semiconductor layer expressed with a general expression $In_xGa_yAl_zN$ (where x+y+z=1.0) falls within a range of 0.3≤x≤1.0 and 0≤z<0.4, even when the film is a non-single crystalline film, it is possible to provide sufficient channel characteristics (having the ON/OFF ratio of $10^2$ or higher) as transistor operation, and, when the composition falls within a range of 0≤z≤0.2 when 0.3≤x<0.7 and 0≤z≤0.1 when 0.7≤x≤1.0, the ON/OFF ratio becomes further higher by an order of magnitude ($10^3$ or higher). Further, when the composition of the nitride semiconductor layer falls within a range of 0.5≤x≤1.0 and 0≤z<0.1, a transistor having excellent transistor characteristics of maximum current density exceeding 5 mA/mm can be obtained.

It should be noted that, as described in the first embodiment, when InN which is a nitride semiconductor having composition of x=1.0 when the nitride semiconductor is expressed with a general expression $In_xGa_yAl_zN$ is used as a channel layer, it is impossible to obtain sufficient transistor characteristics if the film thickness exceeds 10 nm.

Therefore, in order to secure flexibility of design of the semiconductor device, it is preferable to remove InN from the above-described composition range, that is, the In composition ratio x of the nitride semiconductor layer is preferably 0.99 or less (x≤0.99).

It is known that a film of an InGaAlN-based nitride semiconductor containing 1% or higher of Al or Ga, that is, a nitride semiconductor in which x≤0.99 when the nitride semiconductor is expressed with a general expression $In_xGa_yAl_zN$, becomes structurally strong, and a defect is less likely to occur (see, for example, Non Patent Literature 4). This is considered because of a phenomenon that an InGaAlN-based nitride semiconductor containing 1% or higher of Al or Ga is thermodynamically likely to be phase separated, which makes it likely to make concentration of Al or Ga locally non-uniform, resulting in suppressing propagation of dislocation.

Figure 13:
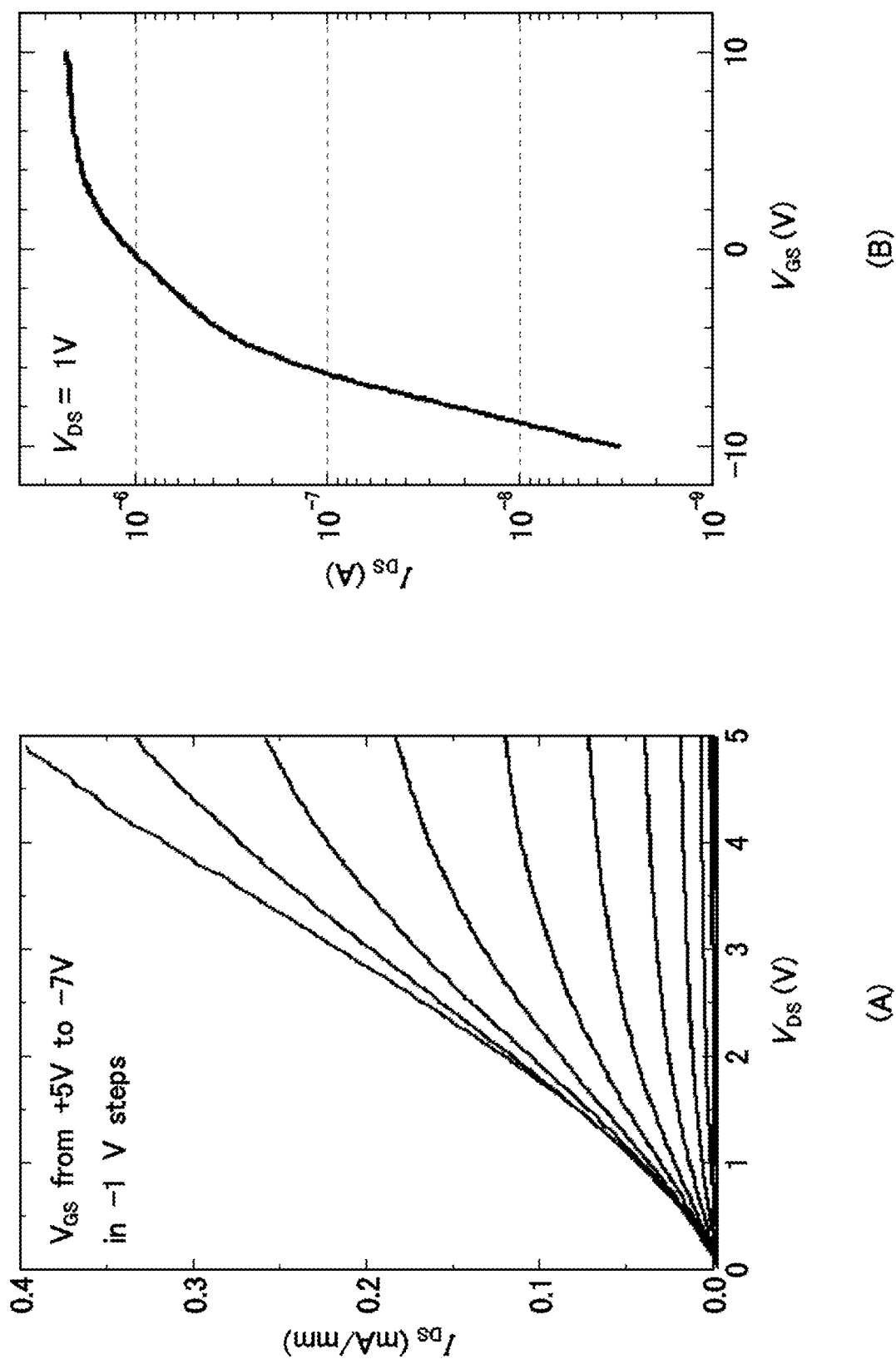
FIG. 13 is a diagram illustrating electric characteristics of a transistor including a nitride semiconductor layer as a channel, the nitride semiconductor layer being expressed as $In_xGa_yAl_zN$ where $x=0.64$, $y=0$ and $z=0.36$.

FIG. 13 is a diagram illustrating electric characteristics of a transistor including a nitride semiconductor layer expressed with $In_xGa_yAl_zN$ where x=0.64, y=0 and z=0.36 as a channel, and FIG. 13(A) illustrates $I_{DS}$-$V_{DS}$ characteristics in the case where $V_{GS}$ is changed in a step of −1 [V] within a range between +5 [V] and −7 [V]. Further, FIG. 13(B) illustrates $I_{DS}$-$V_{GS}$ characteristics under $V_{DS}$ of 1 [V].

This transistor is obtained by depositing 5 nm of a channel layer having composition of $In_{0.64}Al_{0.36}N$ on a fused silica substrate through a sputtering method at an ambient temperature. It should be noted that a gate insulating film is $HfO_2$, a gate length is 5 μm, and a channel width is 50 μm.

The above-described composition falls within a range of 0.3≤x≤1.0 and 0≤z<0.4, the ON/OFF ratio is $7×10^2$, and maximum current density is 0.4 mA/mm.

Figure 14:
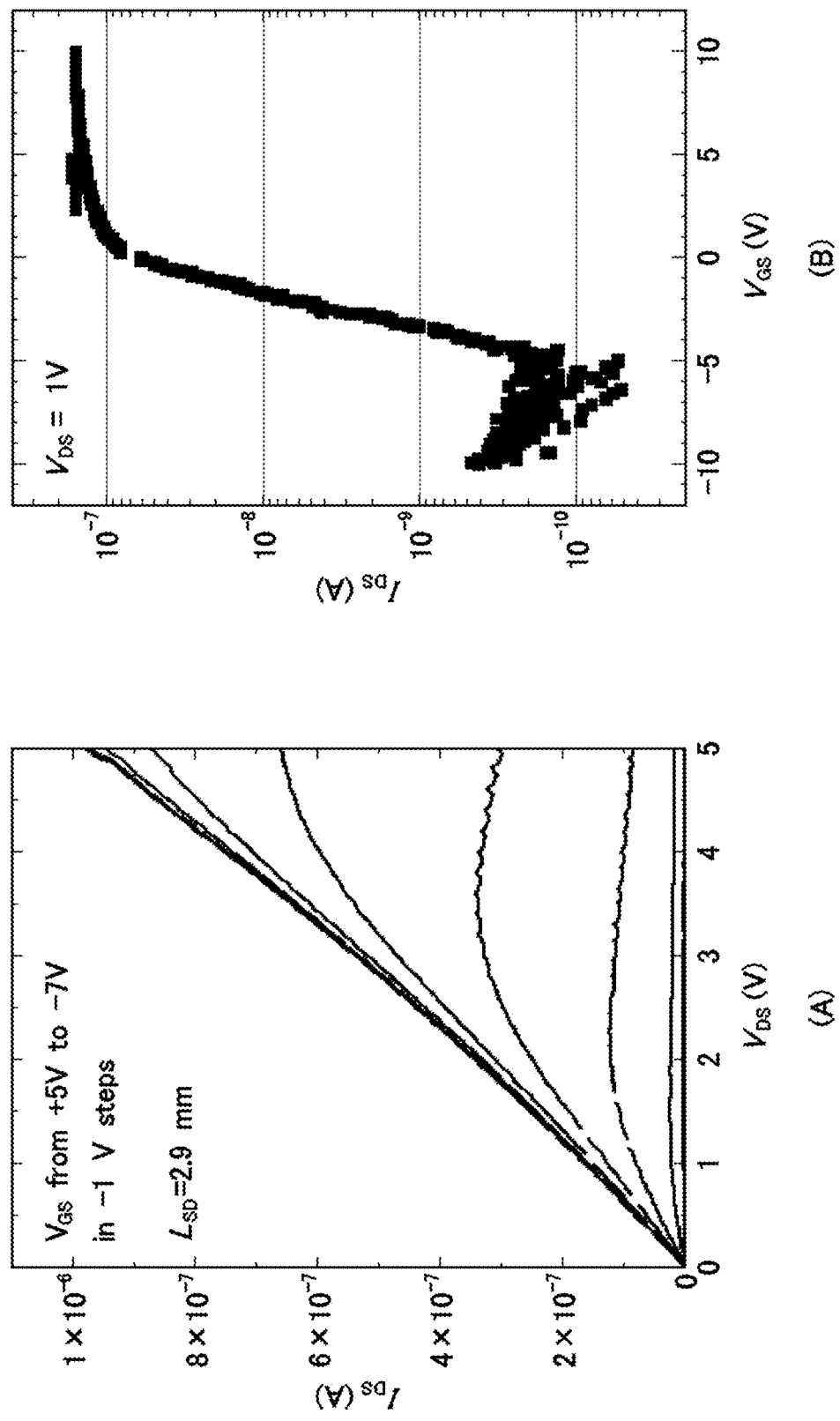
FIG. 14 is a diagram illustrating electric characteristics of a transistor including a nitride semiconductor layer as a channel, the nitride semiconductor layer being expressed as $In_xGa_yAl_zN$ where $x=0.34$, $y=0.33$ and $z=0.33$.

FIG. 14 illustrates electric characteristics of a transistor including a nitride semiconductor layer expressed with $In_xGa_yAl_zN$ where x=0.34, y=0.33 and z=0.33 as a channel, and FIG. 14(A) illustrates $I_{DS}$-$V_{DS}$ characteristics in the case where $V_{GS}$ is changed in a step of −1 [V] within a range between +5 [V] and −7 [V]. Further, FIG. 14(B) illustrates $I_{DS}$-$V_{GS}$ characteristics under $V_{DS}$ of 1 [V].

This transistor is obtained by depositing 5 nm of a channel layer having composition of $In_{0.34}Ga_{0.33}Al_{0.33}N$ on a fused silica substrate at a substrate temperature of 400° C. through the sputtering method. It should be noted that a gate insulating film is $HfO_2$, a gate length is 5 μm, and a channel width is 50 μm.

The above-described composition also falls within a range of 0.3≤z≤1.0 and 0≤z<0.4, and has the ON/OFF ratio of $1×10^3$ and maximum current density of $3.4×10^{-4}$ mA/mm.

Figure 15:
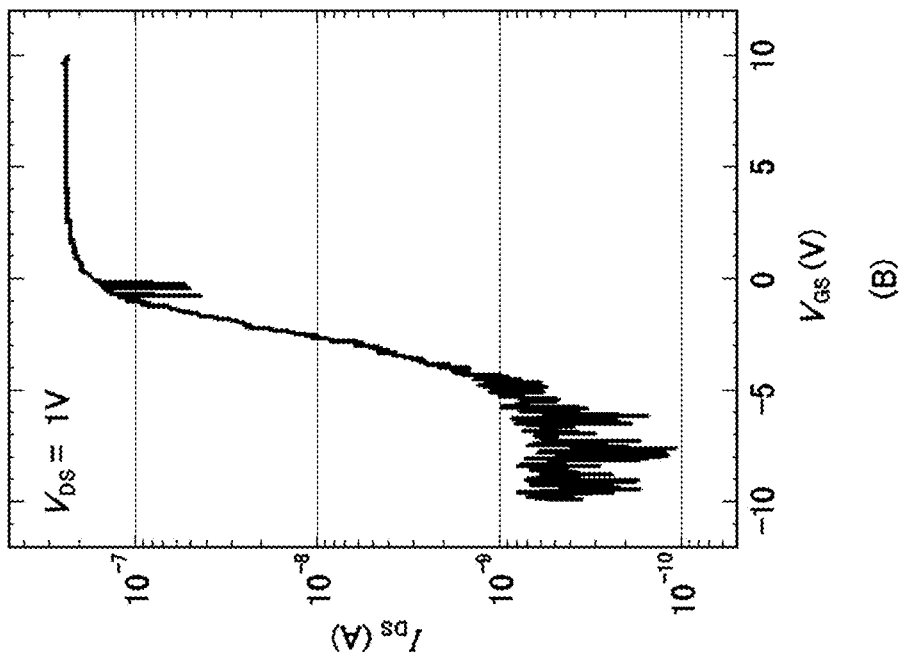
FIG. 15 is a diagram illustrating electric characteristics of a transistor including a nitride semiconductor layer as a channel, the nitride semiconductor layer being expressed as $In_xGa_yAl_zN$ where $x=0.42$, $y=0.42$ and $z=0.16$.
Figure 15:
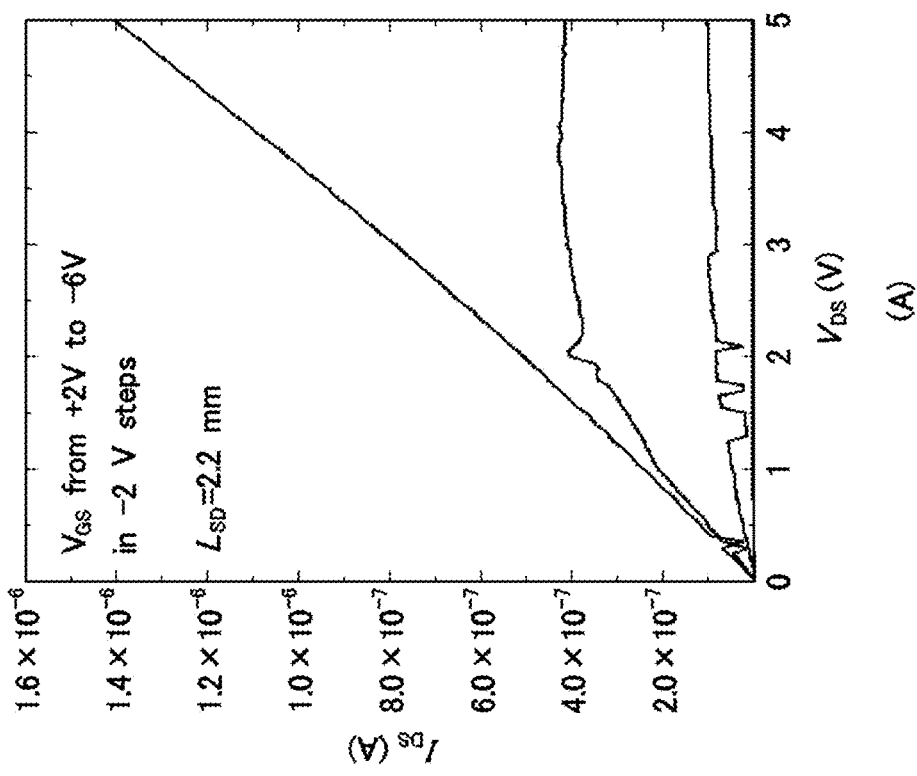

FIG. 15 is a diagram illustrating electric characteristics of a transistor including a nitride semiconductor layer expressed with $In_xGa_yAl_z$ N where x=0.42, y=0.42 and z=0.16 as a channel, and FIG. 15(A) illustrates $I_{DS}$-$V_{DS}$ characteristics in the case where $V_{GS}$ is changed in a step of −2 [V] within a range between +2 [V] and −6 [V]. Further, FIG. 15(B) illustrates $I_{DS}$-$V_{GS}$ characteristics under $V_{DS}$ of 1 [V].

This transistor is obtained by depositing 5 nm of a channel layer having composition of $In_{0.42}Ga_{0.42}Al_{0.16}N$ on a fused silica substrate at a substrate temperature of 400° C. through the sputtering method. It should be noted that a gate insulating film is $HfO_2$, a gate length is 5 μm, and a channel width is 50 μm.

The above-described composition falls within a range of 0.3≤x<0.7 and 0≤z<0.2, and has the ON/OFF ratio of $1×10^3$ and the maximum current density of $1×10^{-3}$ mA/mm.

Figure 16:
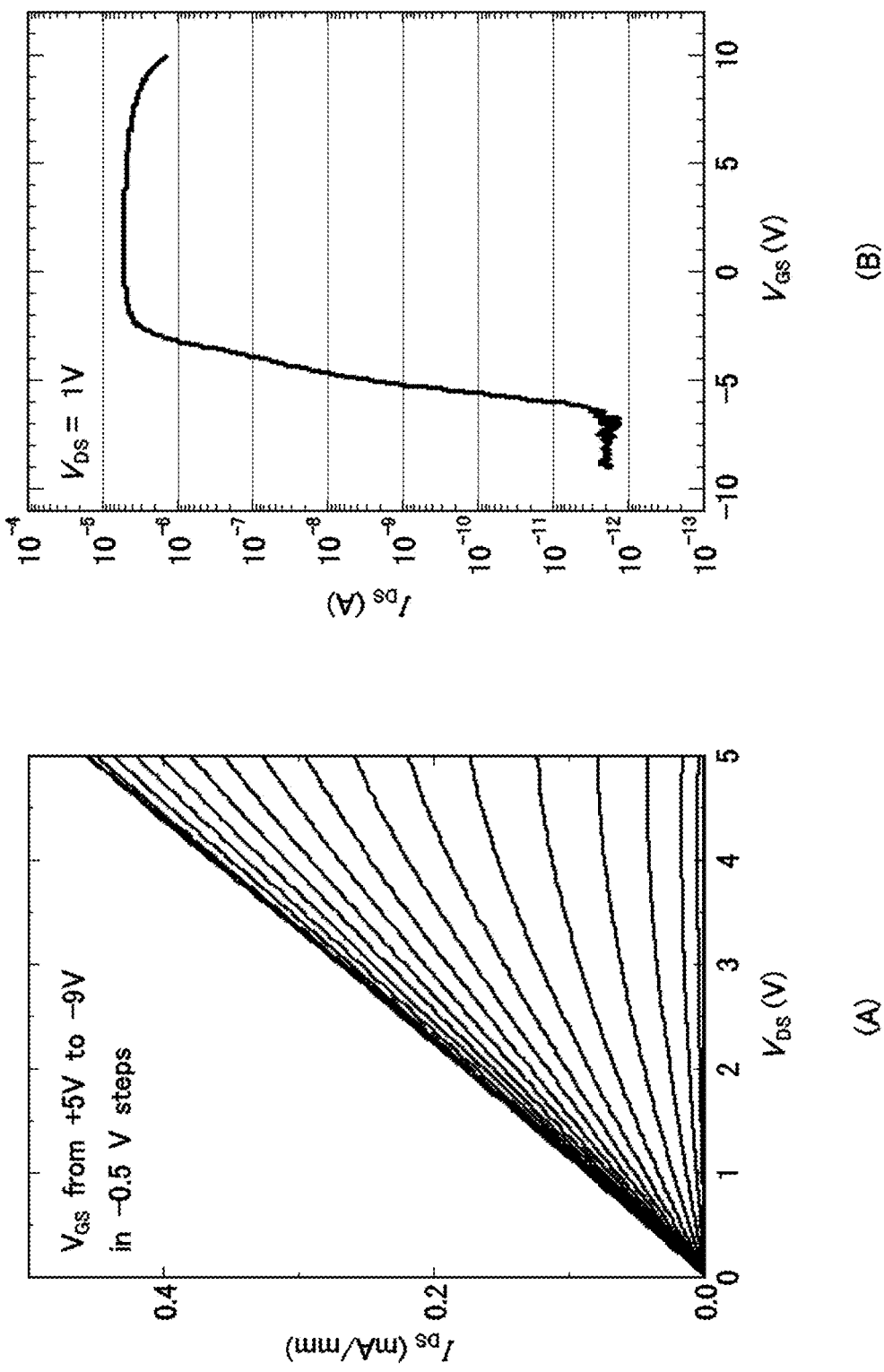
FIG. 16 is a diagram illustrating electric characteristics of a transistor including a nitride semiconductor layer as a channel, the nitride semiconductor layer being expressed as $In_xGa_yAl_zN$ where $x=0.3$, $y=0.7$ and $z=0$.

FIG. 16 is a diagram illustrating electric characteristics of a transistor including a nitride semiconductor layer expressed with $In_xGa_yAl_zN$ where x=0.3, y=0.7 and z=0 as a channel, and FIG. 16(A) illustrates $I_{DS}$-$V_{DS}$ characteristics in the case where $V_{GS}$ is changed in a step of −0.5 [V] within a range between +5 [V] and −9 [V]. Further, FIG. 16(B) illustrates $I_{DS}$-$V_{GS}$ characteristics under $V_{DS}$ of 1 [V].

This transistor is obtained by depositing 30 nm of a channel layer having composition of $In_{0.3}Ga_{0.7}N$ on a fused silica substrate at a substrate temperature of 400° C. through the sputtering method. It should be noted that a gate insulating film is $HfO_2$, a gate length is 5 μm, and a channel width is 50 μm.

The above-described composition also falls within a range of 0.3≤x<0.7 and 0≤z<0.2, and has the ON/OFF ratio of $1×10^6$ and maximum current density of 0.5 mA/mm.

Figure 17:
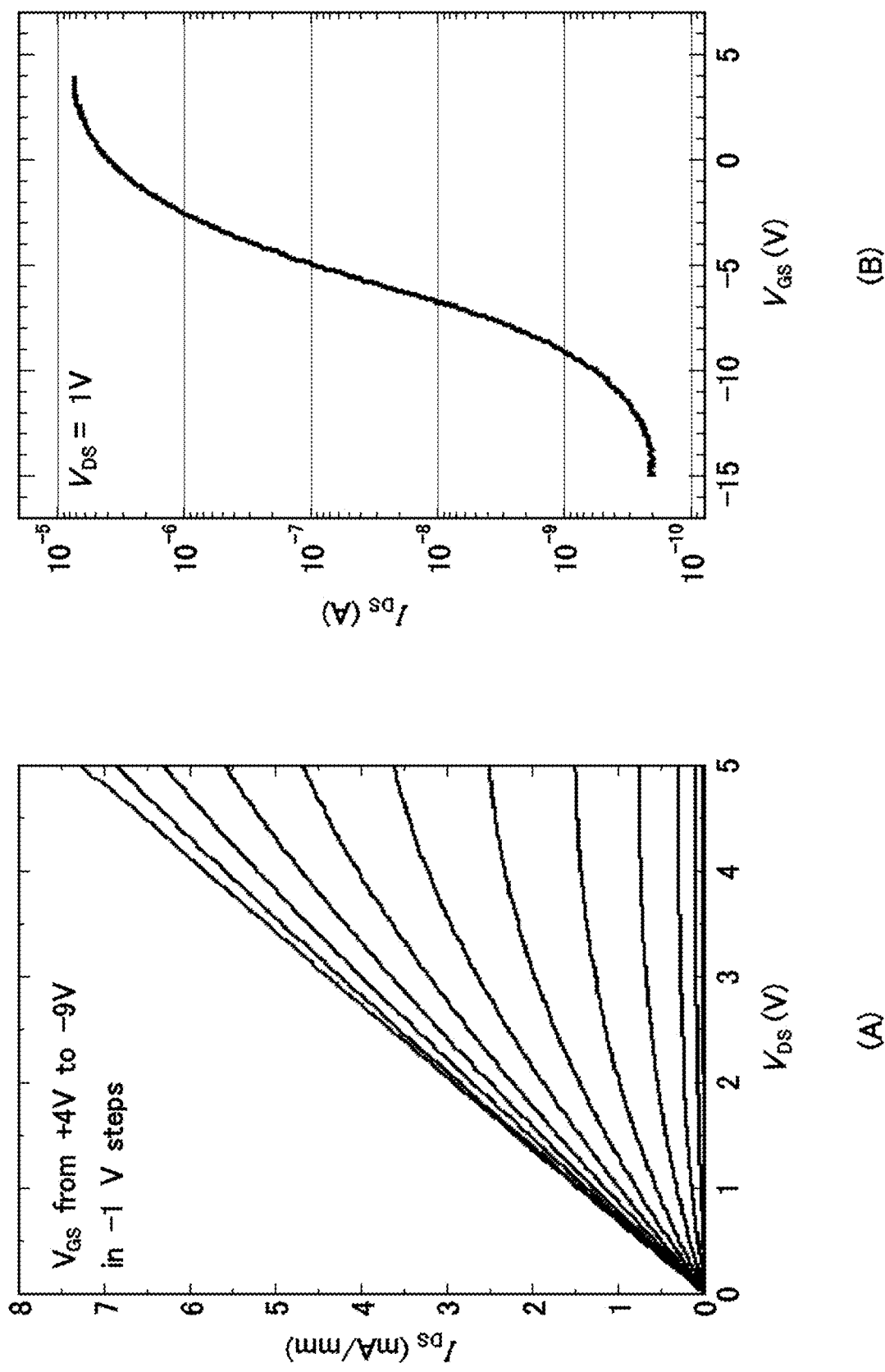
FIG. 17 is a diagram illustrating electric characteristics of a transistor including a nitride semiconductor layer as a channel, the nitride semiconductor layer being expressed as $In_xGa_yAl_zN$ where $x=0.67$, $y=0.33$ and $z=0$.

FIG. 17 is a diagram illustrating electric characteristics of a transistor including a nitride semiconductor layer expressed with $In_xGa_yAl_zN$ where x=0.67, y=0.33 and z=0 as a channel, and FIG. 17(A) illustrates $I_{DS}$-$V_{DS}$ characteristics in the case where $V_{GS}$ is changed in a step of −1 [V] within a range between +4 [V] and −9 [V]. Further, FIG. 17(B) illustrates $I_{DS}$-$V_{GS}$ characteristics under $V_{DS}$ of 1 [V].

This transistor is obtained by depositing 6 nm of a channel layer having composition of $In_{0.67}Ga_{0.33}N$ on a fused silica substrate at a substrate temperature of 400° C. through the sputtering method. It should be noted that a gate insulating film is $HfO_2$, a gate length is 5 μm and a channel width is 50 μm.

The above-described composition falls within a range of 0.5≤x≤1.0 and 0≤z<0.1, and has an ON/OFF ratio of $1×10^4$ and maximum current density of 7.5 mA/mm.

Figure 18:
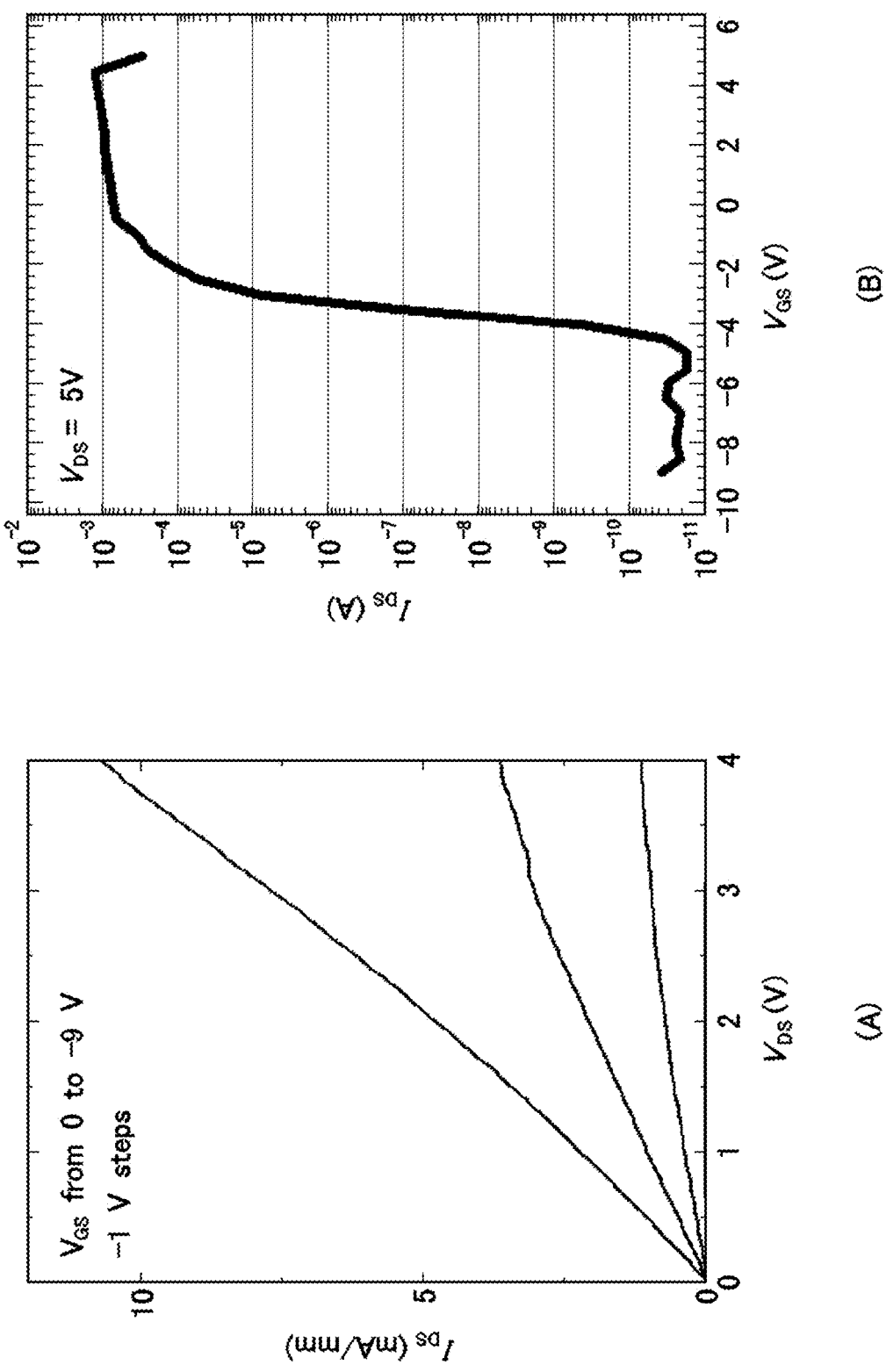
FIG. 18 is a diagram illustrating electric characteristics of a transistor including a nitride semiconductor layer as a channel, the nitride semiconductor layer being expressed as $In_xGa_yAl_zN$ where $x=0.5$, $y=0.5$ and $z=0$.

FIG. 18 is a diagram illustrating electric characteristics of a transistor including a nitride semiconductor layer expressed with $In_xGa_yAl_zN$ where x=0.5, y=0.5 and z=0, and FIG. 18(A) illustrates $I_{DS}$-$V_{DS}$ characteristics in the case where $V_{GS}$ is changed in a step of −1 [V] within a range between 0 [V] and −9 [V]. Further, FIG. 18(B) illustrates $I_{DS}$-$V_{GS}$ characteristics under $V_{DS}$ of 5 [V].

This transistor is obtained by depositing 45 nm of a channel layer having composition of $In_{0.5}Ga_{0.5}N$ on a fused silica substrate at a substrate temperature of 400° C. through the sputtering method. It should be noted that this transistor has a ring gate structure, in which a gate insulating film is $HfO_2$, a gate ring diameter is 100 μm, and a channel length is 10 μm.

The above-described composition also falls within a range of 0.5≤x≤1.0 and 0≤z<0.1, and has an ON/OFF ratio of $1×10^8$ and maximum current density of 25 mA/mm.

The transistor characteristics illustrated in FIGS. 13 to 18 are characteristics of part of a number of transistors experimentally manufactured by the present inventors. As a result of performing characteristics analysis on a number of transistors, the above-described conclusion has been reached as to composition of the nitride semiconductor.

That is, when the composition expressed with a general expression $In_xGa_yAl_zN$ (where x+y+z=1.0) falls within a range of 0.3≤x≤1.0 and 0≤z<0.4, a transistor 1a exhibiting an ON/OFF ratio of $10^2$ or higher can be obtained.

Further, when the composition expressed with a general expression $In_xGa_yAl_zN$ (where x+y+z=1.0) falls within a range of 0.3≤x≤1.0 and 0≤z<0.4, a transistor 1a exhibiting an ON/OFF ratio of $10^2$ or higher can be obtained.

Still further, when the composition expressed with a general expression $In_xGa_yAl_zN$ (where x+y+z=1.0) falls within a range of 0.5≤x≤1.0 and 0≤z<0.1, transistor characteristics having maximum current density exceeding 5 mA/mm can be obtained.

While the semiconductor device according to the present invention including a nitride semiconductor layer expressed with a general expression $In_xGa_yAl_zN$ (where x+y+z=1.0) as a channel has been described above, it goes without saying that the transistor configuration can be variously changed. Some examples of the transistor configuration will be described below.

Figure 19:
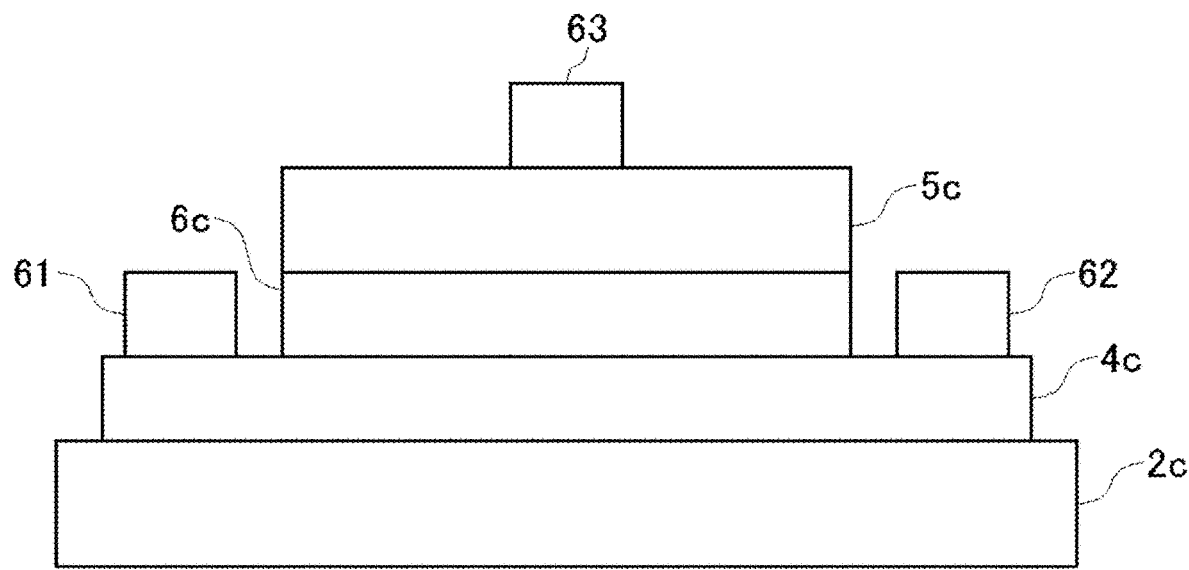
FIG. 19 is a diagram illustrating a configuration example of a transistor having a laminate structure (heterojunction structure) in which an AlN layer and a second nitride semiconductor layer are bonded on the nitride semiconductor layer of $In_xGa_yAl_zN$.

FIG. 19 is a diagram illustrating a configuration example of a transistor 1c having a laminate structure (heterojunction structure) in which an AlN layer and a second nitride semiconductor layer 6c are bonded on the above-described nitride semiconductor layer 4c of $In_xGa_yAl_zN$.

In the example illustrated in FIG. 19, a substrate 2c is a synthetic quartz substrate. The nitride semiconductor layer 4c is, for example, a polycrystalline or amorphous film having a film thickness of 3 nm. An amorphous $HfO_2$ layer having a film thickness of 15 nm is provided on the second nitride semiconductor layer 6c as an insulating layer 5c. By placing the AlN layer between the nitride semiconductor layer 4c and the $HfO_2$ layer as the insulating layer 5c, as the second nitride semiconductor layer 6c, a favorable interface is obtained.

Figure 20:
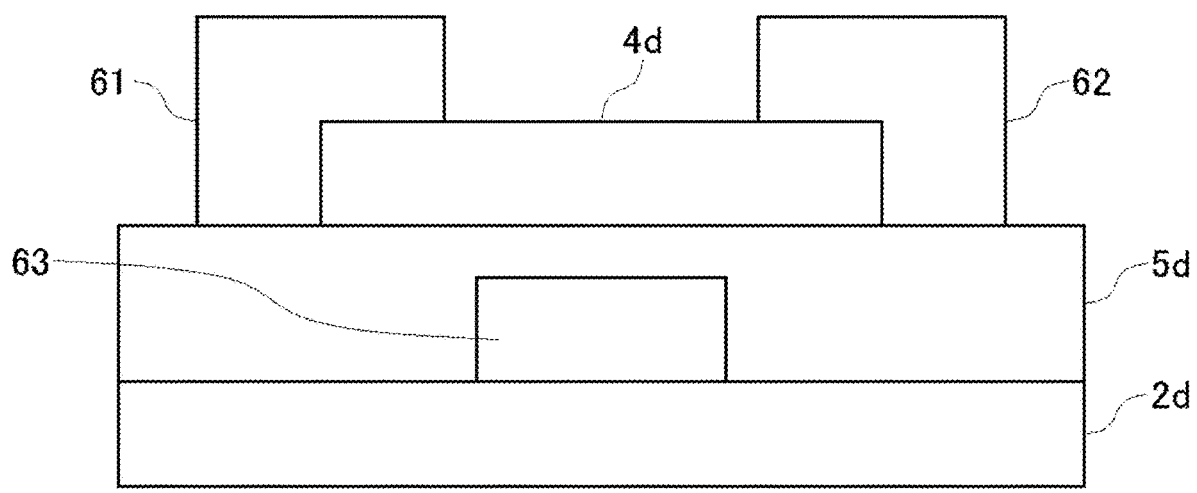
FIG. 20 is a diagram illustrating a configuration example of a transistor having a bottom gate structure.

FIG. 20 is a diagram illustrating a configuration example of a transistor 1d having a bottom gate structure.

Also in the example illustrated in FIG. 20, a substrate 2d is a synthetic quartz substrate. A nitride semiconductor layer 4d is, for example, a polycrystalline or amorphous film having a film thickness of 3 nm. An amorphous $HfO_2$ layer having a film thickness between 100 nm and 150 nm is provided between the nitride semiconductor layer 4d and the substrate 2d as an insulating layer 5d, and a gate 63 is formed with an ITO film having a thickness of approximately 90 nm.

As described above, the semiconductor device according to the present invention may have a laminate structure (heterojunction structure) in which the second nitride semiconductor layer having a different composition from that of the nitride semiconductor layer is bonded on at least one principle surface of the above-described nitride semiconductor layer.

At this time, the second nitride semiconductor layer may be a nitride semiconductor layer expressed with the above-described general expression $In_xGa_yAl_zN$ (where x+y+z=1.0). For example, a transistor may be configured such that the nitride semiconductor layer is $In_{x1}Ga_{y1}Al_{z1}N$, and the second nitride semiconductor layer is $In_{x2}Ga_{y2}Al_{z2}N$ (where x2≠x1), and may be configured to have a double heterostructure in which the nitride semiconductor layer of $In_{x1}Ga_{y1}Al_{z1}N$ is vertically put between the second nitride semiconductor layer of $In_{x2}Ga_{y2}Al_{z2}N$.

INDUSTRIAL APPLICABILITY

According to the present invention, it is possible to provide a semiconductor device in which constraints to manufacturing conditions are drastically eliminated, and which includes an InGaAlN-based nitride semiconductor layer which is inexpensive and has excellent electric characteristics.

REFERENCE SIGNS LIST

1a, 1b, 1c, 1d transistor
2a, 2b, 2c, 2s substrate
3a first insulating layer
4a, 4b, 4c, 4d nitride semiconductor layer
5a second insulating layer 5b, 5c, 5d insulating layer
6c second nitride semiconductor layer
61 source electrode
62 drain electrode
63 gate electrode
S1a, S1b principle surface

The invention claimed is:

1. A field effect transistor, comprising:
a foundation layer;
a nitride semiconductor layer as an n-type channel, the nitride semiconductor layer consisting of a nitride semiconductor having a formula of $In_xGa_yAl_zN$ where x, y, and z satisfy x+y+z=1.0, 0.3≤x≤0.99, and 0≤z<0.4, wherein the nitride semiconductor is polycrystalline or amorphous;
an insulating layer provided on a surface of the nitride semiconductor layer; and
a gate electrode provided on and directly bonded to a principal surface of the insulating layer and facing the nitride semiconductor layer such that the insulating layer is interposed between the gate electrode and the nitride semiconductor layer,
wherein the nitride semiconductor layer is provided on and in direct contact with the foundation layer and has a thickness of from 1 nm to 10 nm,
wherein the foundation layer is an insulating substrate, or an insulating amorphous layer provided directly between a substrate and the nitride semiconductor layer, and
wherein the field effect transistor is a depletion type field effect transistor.

2. The field effect transistor according to claim 1, wherein x and z satisfy 0≤z<0.2 and 0.33x<0.7, or 0≤z<0.1 and 0.7≤x≤0.99.

3. The field effect transistor according to claim 2, wherein x and z satisfy 0.5≤x≤0.99 and 0≤z<0.1.

4. The field effect transistor according to claim 1, wherein x satisfies 0.3≤x≤0.67.

5. The field effect transistor according to claim 1, wherein the foundation layer is an insulating amorphous layer comprising $HfO_2$, $Al_2O_3$, or $SiO_2$.

6. The field effect transistor according to claim 1, wherein the substrate is a non-single crystalline substrate.

7. The field effect transistor according to claim 1, wherein the foundation layer is an insulating substrate.

8. The field effect transistor according to claim 7, wherein the insulating substrate is a synthetic quartz substrate.

9. The field effect transistor according to claim 1, wherein an ON/OFF ratio of the field effect transistor is $10^2$ or higher.

10. The field effect transistor according to claim 1, wherein the nitride semiconductor layer has a thickness of from 1 nm to 5 nm.

11. The field effect transistor according to claim 5, wherein the insulating amorphous layer has a thickness of from 1 nm to 20 nm.

12. The field effect transistor according to claim 1, wherein the nitride semiconductor in the nitride semiconductor layer is polycrystalline.

13. The field effect transistor according to claim 1, wherein the nitride semiconductor in the nitride semiconductor layer is amorphous.

14. A field effect transistor, comprising:
a substrate;
a first insulating layer;
a nitride semiconductor layer;
a second insulating layer;
a source electrode;
a drain electrode; and
a gate electrode,
wherein the first insulating layer, the nitride semiconductor layer, and the second insulating layer are sequentially provided on a principal surface of the substrate,
wherein the nitride semiconductor layer consists of a nitride semiconductor having a formula of $In_xGa_yAl_zN$ where x, y, and z satisfy x+y+z=1.0, 0.3<x<0.99, and 0≤z<0.4,
wherein the nitride semiconductor is polycrystalline or amorphous,
wherein the source electrode and the drain electrode are bonded to the nitride semiconductor layer and the second insulating layer,
wherein the gate electrode is provided on and directly bonded to a principal surface of the second insulating layer and facing the nitride semiconductor layer such that the second insulating layer is interposed between the gate electrode and the nitride semiconductor layer,
wherein the field effect transistor is an InGaAlN-based or InGaN-based semiconductor device and includes the nitride semiconductor layer as an n-type channel, and
wherein the field effect transistor is a depletion type field effect transistor.

15. A field effect transistor, comprising:
a substrate;
a nitride semiconductor layer;
an insulating layer;
a source electrode;
a drain electrode; and
a gate electrode,
wherein the nitride semiconductor layer and the insulating layer are sequentially provided on a principal surface of the substrate,
wherein the nitride semiconductor layer consists of a nitride semiconductor having a formula of $In_xGa_yAl_zN$ where x, y, and z satisfy x+y+z=1.0, 0.3≤x<0.99, and 0≤z<0.4,
wherein the nitride semiconductor is polycrystalline or amorphous,
wherein the source electrode and the drain electrode are bonded to the nitride semiconductor layer and the insulating layer,
wherein the gate electrode is provided on and directly bonded to a principal surface of the insulating layer and facing the nitride semiconductor layer such that the insulating layer is interposed between the gate electrode and the nitride semiconductor layer,
wherein the field effect transistor is an InGaAlN-based or InGaN-based semiconductor device and includes the nitride semiconductor layer as an n-type channel, and
wherein the field effect transistor is a depletion type field effect transistor.

16. A field effect transistor having a bottom gate structure, comprising:
a substrate;
an insulating layer;
a nitride semiconductor layer;
a source electrode;
a drain electrode; and
a gate electrode,
wherein the insulating layer is provided between the nitride semiconductor layer and the substrate, wherein the nitride semiconductor layer consists of a nitride semiconductor having a formula of $In_xGa_yAl_zN$ where x, y, and z satisfy $x+y+z=1.0$, $0.3<x<0.99$, and $0 \leq z<0.4$, wherein the nitride semiconductor is polycrystalline or amorphous, wherein the source electrode and the drain electrode electrically contact the nitride semiconductor layer, wherein the gate electrode is provided between the substrate and the insulating layer, wherein the field effect transistor is an InGaAlN-based or InGaN-based semiconductor device and includes the nitride semiconductor layer as an n-type channel, and wherein the field effect transistor is a depletion type field effect transistor.

17. The field effect transistor according to claim 1, wherein the nitride semiconductor layer consists of a single layer consisting of a single material of the nitride semiconductor having the formula of $In_xGa_yAl_zN$.

18. The field effect transistor according to claim 14, wherein the nitride semiconductor layer consists of a single layer consisting of a single material of the nitride semiconductor having the formula of $In_xGa_yAl_zN$.

19. The field effect transistor according to claim 15, wherein the nitride semiconductor layer consists of a single layer consisting of a single material of the nitride semiconductor having the formula of $In_xGa_yAl_zN$.

20. The field effect transistor according to claim 16, wherein the nitride semiconductor layer consists of a single layer consisting of a single material of the nitride semiconductor having the formula of $In_xGa_yAl_zN$.

* * * * *

UNITED STATES PATENT AND TRADEMARK OFFICE
CERTIFICATE OF CORRECTION

PATENT NO. : 12,237,423 B2
APPLICATION NO. : 14/912702
DATED : February 25, 2025
INVENTOR(S) : Hiroshi Fujioka et al.

Page 1 of 1

It is certified that error appears in the above-identified patent and that said Letters Patent is hereby corrected as shown below:

In the Claims

In Column 17, Claim 2, Line 33, delete "$0.33x<0.7$," and insert -- $0.3 \leq x < 0.7$, --, therefor.

In Column 18, Claim 14, Line 10, delete "$0.3<x<0.99$," and insert -- $0.3 \leq x \leq 0.99$, --, therefor.

In Column 18, Claim 15, Line 41, delete "$0.3 \leq x<0.99$," and insert -- $0.3 \leq x \leq 0.99$, --, therefor.

In Column 19, Claim 16, Line 3, delete "$0.3<x<0.99$," and insert -- $0.3 \leq x \leq 0.99$, --, therefor.

Signed and Sealed this
Twenty-sixth Day of August, 2025

Coke Morgan Stewart
*Acting Director of the United States Patent and Trademark Office*